US012765128B2

(12) United States Patent
Lee et al.

(10) Patent No.: US 12,765,128 B2
(45) Date of Patent: Oct. 13, 2026

(54) DISPLAY DEVICE AND MANUFACTURING METHOD THEREFOR

(71) Applicant: Samsung Display Co., LTD., Yongin-si (KR)

(72) Inventors: Jong Chan Lee, Suwon-si (KR); Sung Geun Bae, Busan (KR); Sung Jin Lee, Yongin-si (KR); Tae Hee Lee, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 489 days.

(21) Appl. No.: 18/019,773

(22) PCT Filed: Sep. 25, 2020

(86) PCT No.: PCT/KR2020/013044

§ 371 (c)(1),
(2) Date: Feb. 3, 2023

(87) PCT Pub. No.: WO2022/030679

PCT Pub. Date: Feb. 10, 2022

(65) Prior Publication Data

US 2023/0343899 A1 Oct. 26, 2023

(30) Foreign Application Priority Data

Aug. 6, 2020 (KR) ........................ 10-2020-0098628

(51) Int. Cl.

*H10H 20/831* (2025.01)
*H10H 20/01* (2025.01)
(Continued)

(52) U.S. Cl.

CPC ...... *H10H 20/8312* (2025.01); *H10H 20/857* (2025.01); *H10W 90/00* (2026.01); *H10H 20/032* (2025.01)

(58) Field of Classification Search

CPC ............. H10H 20/8312; H10H 20/857; H10H 20/032; H10H 20/85; H10H 20/01

See application file for complete search history.

(56) References Cited

U.S. PATENT DOCUMENTS 11,088,126 B2 8/2021 Heo et al.
11,211,534 B2 12/2021 Bae et al.
(Continued)

FOREIGN PATENT DOCUMENTS

CN 107705713 A 2/2018
CN 110828422 A 2/2020
(Continued)

OTHER PUBLICATIONS

International Search Report for corresponding Application No. PCT/KR2020/013044, dated Apr. 24, 2021, pp. 1-4.

*Primary Examiner* — Monica D Harrison
*Assistant Examiner* — Jacob T Nelson
(74) *Attorney, Agent, or Firm* — Womble Bond Dickinson (US) LLP

(57) ABSTRACT

A display device including: a substrate; a first electrode on the substrate; a second electrode spaced from the first electrode on the substrate; a light emitting element on the first electrode and the second electrode, respective ends of the light emitting element being on the first electrode and the second electrode; a first insulating pattern on the light emitting element and exposing the ends of the light emitting element; and a second insulating pattern on the first electrode and spaced from the first insulating pattern, wherein the first insulating pattern and the second insulating pattern comprise a same material.

19 Claims, 32 Drawing Sheets

(51) Int. Cl.
*H10H 20/857* (2025.01)
*H10W 90/00* (2026.01)

(56) References Cited

U.S. PATENT DOCUMENTS

| | | | | |
|---|---|---|---|---|
| 11,637,094 | B2 | 4/2023 | Heo et al. | |
| 11,978,834 | B2 | 5/2024 | Li et al. | |
| 12,021,170 | B2 | 6/2024 | Li et al. | |
| 2016/0172339 | A1* | 6/2016 | Do | H01L 25/0753 257/89 |
| 2018/0175106 | A1* | 6/2018 | Kim | H10H 20/84 |
| 2019/0115513 | A1* | 4/2019 | Im | H10H 20/857 |
| 2019/0319168 | A1* | 10/2019 | Kim | H10H 20/819 |
| 2020/0168662 | A1* | 5/2020 | Kim | H10H 29/142 |
| 2021/0359166 | A1* | 11/2021 | Jung | H10H 20/84 |
| 2022/0005978 | A1 | 1/2022 | Im et al. | |

FOREIGN PATENT DOCUMENTS

| | | | |
|---|---|---|---|
| CN | 111276090 | A | 6/2020 |
| KR | 10-1436123 | B1 | 11/2014 |
| KR | 2018-0077742 | A | 7/2018 |
| KR | 2020-0006209 | A | 1/2020 |
| KR | 2020-0010704 | | 1/2020 |
| KR | 2020-0013190 | A | 2/2020 |
| KR | 10-2094807 | B1 | 3/2020 |
| KR | 2020-0021574 | A | 3/2020 |
| KR | 2020-0034896 | A | 4/2020 |
| KR | 2020-0063380 | A | 6/2020 |
| KR | 2020-0077671 | A | 7/2020 |
| WO | WO 2020105824 | A1 | 5/2020 |

* cited by examiner

DISPLAY DEVICE AND MANUFACTURING METHOD THEREFOR

CROSS REFERENCE TO RELATED APPLICATIONS

This application is a U.S. National Phase Patent Application of International Application No. PCT/KR2020/013044, filed on Sep. 25, 2020, which claims priority to Korean Patent Application No. 10-2020-0098628, filed on Aug. 6, 2020, in the Korean Intellectual Property Office (KIPO), the entire contents of all of which are incorporated by reference herein.

BACKGROUND

1. Field

The present disclosure relates to a display device and a manufacturing method therefor.

2. Description of the Related Art

The importance of display devices has steadily increased with the development of multimedia technology. In response thereto, various types of display devices such as an organic light emitting diode (OLED) display, a liquid crystal display (LCD) and the like have been used.

A display device is a device for displaying an image, and includes a display panel, such as an organic light emitting display panel or a liquid crystal display panel. The light emitting display panel may include light emitting elements, e.g., light emitting diodes (LED), and examples of the light emitting diode include an organic light emitting diode (OLED) using an organic material as a fluorescent material and an inorganic light emitting diode using an inorganic material as a fluorescent material.

SUMMARY

Aspects and features of embodiments of the present disclosure provide a display device having improved reliability by removing separated light emitting elements.

It should be noted that aspects and features of embodiments of the disclosure are not limited thereto and other aspects and features, which are not mentioned herein, will be apparent to those of ordinary skill in the art from the following description.

According to one or more embodiments of the present disclosure, a display device includes a substrate, a first electrode on the substrate, a second electrode spaced from the first electrode on the substrate, a light emitting element on the first electrode and the second electrode, respective ends of the light emitting element being on the first electrode and the second electrode, a first insulating pattern on the light emitting element and exposing the ends of the light emitting element, and a second insulating pattern on the first electrode and spaced from the first insulating pattern, wherein the first insulating pattern and the second insulating pattern include a same material.

The display device may further include a first contact electrode in contact with one end of the light emitting element and the first electrode, wherein the first contact electrode may be on the first electrode and covers the first insulating pattern.

The display device may further include a first insulating layer on the first electrode and the second electrode, wherein the light emitting element and the second insulating pattern may be on the first insulating layer, and the first contact electrode may be in contact with the first electrode through a first opening penetrating through the first insulating layer.

The first opening does not overlap the first insulating pattern and the second insulating pattern in a thickness direction of the substrate.

The display device may further include a third insulating pattern on the second electrode and spaced from the first insulating pattern and the second insulating pattern, wherein the third insulating pattern may include the same material as the first and second insulating patterns.

The display device may further comprise a first contact electrode disposed on the first electrode and in contact with one end of the light emitting element and the first electrode, and a second contact electrode on the second electrode and in contact with the other end of the light emitting element and the second electrode, wherein the first contact electrode and the second contact electrode may be spaced from each other on the first insulating pattern.

The first contact electrode may cover the first insulating pattern, and the second contact electrode may cover the third insulating pattern.

A thickness of the first insulating pattern may be greater than a thickness of the second insulating pattern.

The second insulating pattern does not overlap both ends of the first electrode in a thickness direction of the substrate.

Each of the first insulating pattern and the second insulating pattern may have an island shape in a plan view.

A cross-sectional shape of the second insulating pattern may be a shape in which one side surface of the second insulating pattern opposing the first insulating pattern is parallel to the first insulating pattern and an other side surface of the second insulating pattern protrudes.

According to one or more embodiments of the present disclosure, a display device includes a substrate, a first electrode on one surface of the substrate and extending in a first direction, a second electrode spaced from the first electrode, on the one surface of the substrate, and extending in the first direction, a light emitting element on the first electrode and the second electrode, respective ends of the light emitting element being on the first electrode and the second electrode, a first insulating pattern on the substrate in an area between the first electrode and the second electrode and extending in the first direction, and a second insulating pattern spaced from the first insulating pattern, on the first electrode, and extending in the first direction, wherein at least a portion of the first insulating pattern is on the light emitting element, and does not overlap the ends of the light emitting element in a thickness direction of the substrate, and the second insulating pattern does not overlap both ends of the first electrode in the thickness direction of the substrate.

The display device may further include a first contact electrode in contact with one end of the light emitting element and the first electrode, extending in the first direction, and covering the second insulating pattern.

The first insulating pattern and the second insulating pattern may include a same material.

According to one or more embodiments of the present disclosure, a manufacturing method for a display device includes preparing a substrate including a first electrode and a second electrode that are spaced from and opposing each other, and a plurality of light emitting elements on the first electrode or the second electrode, and disposing a shadow mask on the substrate and forming an insulating pattern material layer on the first electrode and the second electrode as well as on an area between the first electrode and the second electrode using the shadow mask, wherein the insulating pattern material layer overlaps one end of the first electrode opposing the second electrode and one end of the second electrode opposing the first electrode, in a thickness direction of the substrate, and does not overlap an other end of the first electrode and an other end of the second electrode in the thickness direction of the substrate.

The plurality of light emitting elements may include a first light emitting element having respective ends on the first electrode and the second electrode, and a second light emitting element having at least one of the ends not on the first electrode or the second electrode, and the insulating pattern material layer may cover the first light emitting element.

The insulating pattern material layer does not overlap the second light emitting element in the thickness direction of the substrate, the manufacturing method for a display device may further comprise after the forming of the insulating pattern material layer, removing the second light emitting element.

In the removing of the second light emitting element, the first light emitting element may be covered by the insulating pattern material layer and is not removed.

The manufacturing method may further include forming a first insulating pattern, a second insulating pattern, and a third insulating pattern by etching the insulating pattern material layer, wherein the first insulating pattern may be on the plurality of light emitting elements and exposes both ends of the plurality of light emitting elements, the second insulating pattern may be on the first electrode, the third insulating pattern may be on the second electrode, and the first insulating pattern, the second insulating pattern, and the third insulating pattern may be spaced from each other.

The manufacturing method may further include forming a first contact electrode in contact with one ends of the plurality of light emitting elements and the first electrode and a second contact electrode in contact with other ends of the plurality of light emitting elements and the second electrode, wherein the first contact electrode and the second contact electrode may be spaced from each other, the first contact electrode may be on the first electrode and covers the second insulating pattern, and the second contact electrode may be on the second electrode and covers the third insulating pattern.

The details of other embodiments are included in the detailed description and the accompanying drawings.

With a display device and a manufacturing method therefor according to one or more embodiments, by partially forming an insulating pattern material layer using a shadow mask, it is possible to fix light emitting elements (hereinafter, referred to as first light emitting elements) of which both ends are disposed on a first electrode and a second electrode and remove light emitting elements (hereinafter, referred to as second light emitting elements or separated light emitting elements) of which at least one of both ends is not disposed on the first electrode or the second electrode. Accordingly, a defect of the display device that may be caused by the separated light emitting elements may be decreased, and the separated light emitting elements may be recovered and recycled, and thus, a material cost of the display device may be reduced.

The effects, aspects, and features according to embodiments of the present disclosure are not limited by the contents exemplified above, and more various effects, aspects, and features are included in the present disclosure.

DETAILED DESCRIPTION

The present disclosure will now be described more fully hereinafter with reference to the accompanying drawings, in which embodiments of the present disclosure are shown. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Hereinafter, embodiments will be described with reference to the accompanying drawings.

Figure 1:
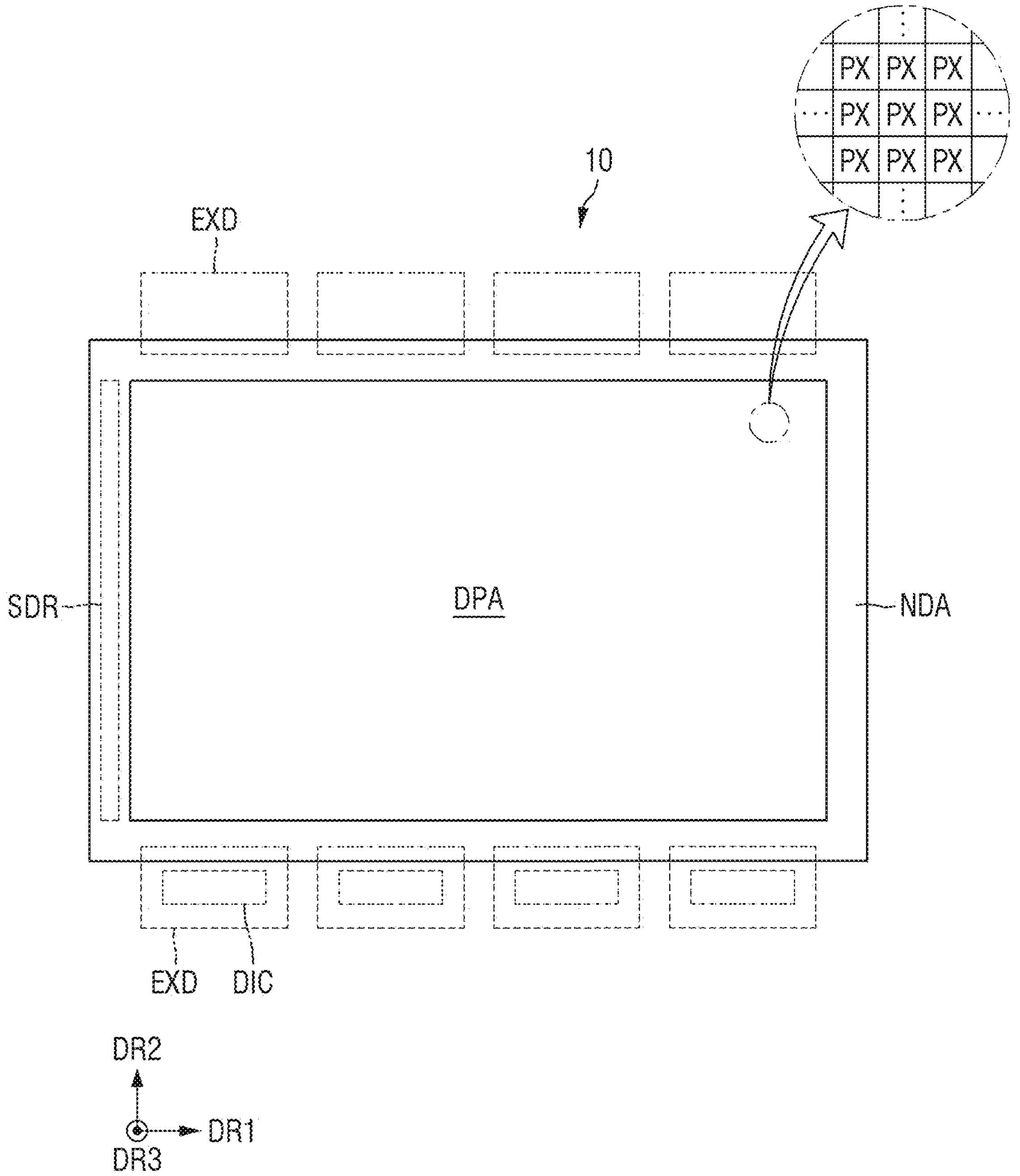
FIG. 1 is a schematic plan view of a display device according to one or more embodiments.

FIG. 1 is a schematic plan view of a display device according to one or more embodiments.

Referring to FIG. 1, a display device 10 displays a moving image or a still image. The display device 10 may refer to all electronic devices that provide display screens. For example, televisions, laptop computers, monitors, billboards, the Internet of Things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras, camcorders, and the like, which provide display screens, may be included in the display device 10.

The display device 10 includes a display panel providing the display screen. Examples of the display panel may include an inorganic light emitting diode display panel, an organic light emitting display panel, a quantum dot light emitting display panel, a plasma display panel, a field emission display panel, and the like. Hereinafter, a case where an inorganic light emitting diode display panel is applied as an example of the display panel will be described by way of example, but the present disclosure is not limited thereto, and the same technical spirit may be applied to other display panels if applicable.

Hereinafter, a first direction DR1, a second direction DR2, and a third direction DR3 are defined in the drawings of one or more embodiments for describing the display device 10. The first direction DR1 and the second direction DR2 may be directions perpendicular to each other in one plane. The third direction DR3 may be a direction perpendicular to the plane in which the first direction DR1 and the second direction DR2 are positioned. The third direction DR3 is perpendicular to each of the first direction DR1 and the second direction DR2. In one or more embodiments for describing the display device 10, the third direction DR3 refers to a thickness direction (or a display direction) of the display device 10.

The display device 10 may have a rectangular shape, in a plan view, in which the sides (e.g., the long sides) extending in the first direction DR1 is longer than the sides (e.g., short sides) extending in the second direction DR2. A corner portion where the long side and the short side of the display device 10 meet in a plan view may be right-angled, but is not limited thereto, and may also have a rounded curved shape. A shape of the display device 10 is not limited to those described above, and may be variously modified. For example, the shape of the display device 10 may also be other shapes such as a square shape, a quadrangular shape with rounded corners (vertices), other polygonal shapes, and a circular shape in a plan view.

A display surface of the display device 10 may be disposed on one side of the display device 10 in the third direction DR3, which is the thickness direction (e.g., the third direction DR3). In one or more embodiments for describing the display device 10, unless otherwise stated, "upper portion" is one side in the third direction DR3 and refers to the display direction, and "upper surface" refers to a surface facing one side in the third direction DR3. In addition, "lower portion" is the other side in the third direction DR3 and refers to a direction opposite to the display direction, and "lower surface" refers to a surface facing the other side in the third direction DR3. In addition, "left", "right", "upper", and "lower" refer to directions when the display device 10 is viewed in a plan view. For example, "right side" refers to one side in the first direction DR1, "left side" refers to the other side in the first direction DR1, "upper side" refers to one side in the second direction DR2, and "lower side" refers to the other side in the second direction DR2.

The display device 10 may include a display area DPA and non-display areas NDA along an edge or periphery of the display area DPA. The display area DPA is an area in which an image may be displayed, and the non-display area NDA is an area in which no image is displayed.

A shape of the display area DPA may follow the shape of the display device 10. For example, the shape of the display area DPA may have a rectangular shape in a plan view, similar to the overall shape of the display device 10. The display area DPA may occupy substantially the center (or the central portion) of the display device 10.

The display area DPA may include a plurality of pixels PX. The plurality of pixels PX may be arranged in a matrix direction (e.g., arranged along rows and columns of a matrix). A shape of each pixel PX may be a rectangular or square shape in a plan view. Each pixel PX may include light emitting elements made of inorganic particles.

The non-display areas NDA may be disposed around the display area DPA. The non-display areas NDA may entirely or partially surround the display area DPA. The non-display areas NDA may constitute a bezel of the display device 10.

Driving circuits or driving elements for driving the display area DPA may be disposed in the non-display areas NDA. For example, pad parts may be provided on a substrate of the display device 10 in a non-display area NDA disposed adjacent to a first long side (lower side in FIG. 1) of the display device 10 and/or a non-display area NDA disposed adjacent to a second long side (upper side in FIG. 1) of the display device 10, and external devices EXD may be mounted on pad electrodes of the pad parts. Examples of the external devices EXD may include a connection film, a printed circuit board, a driving chip DIC, a connector, a wiring connection film, and the like. A scan driver SDR and the like formed on the substrate of the display device 10 may be disposed in a non-display area NDA disposed adjacent to a first short side (left side in FIG. 1) of the display device 10.

Figure 2:
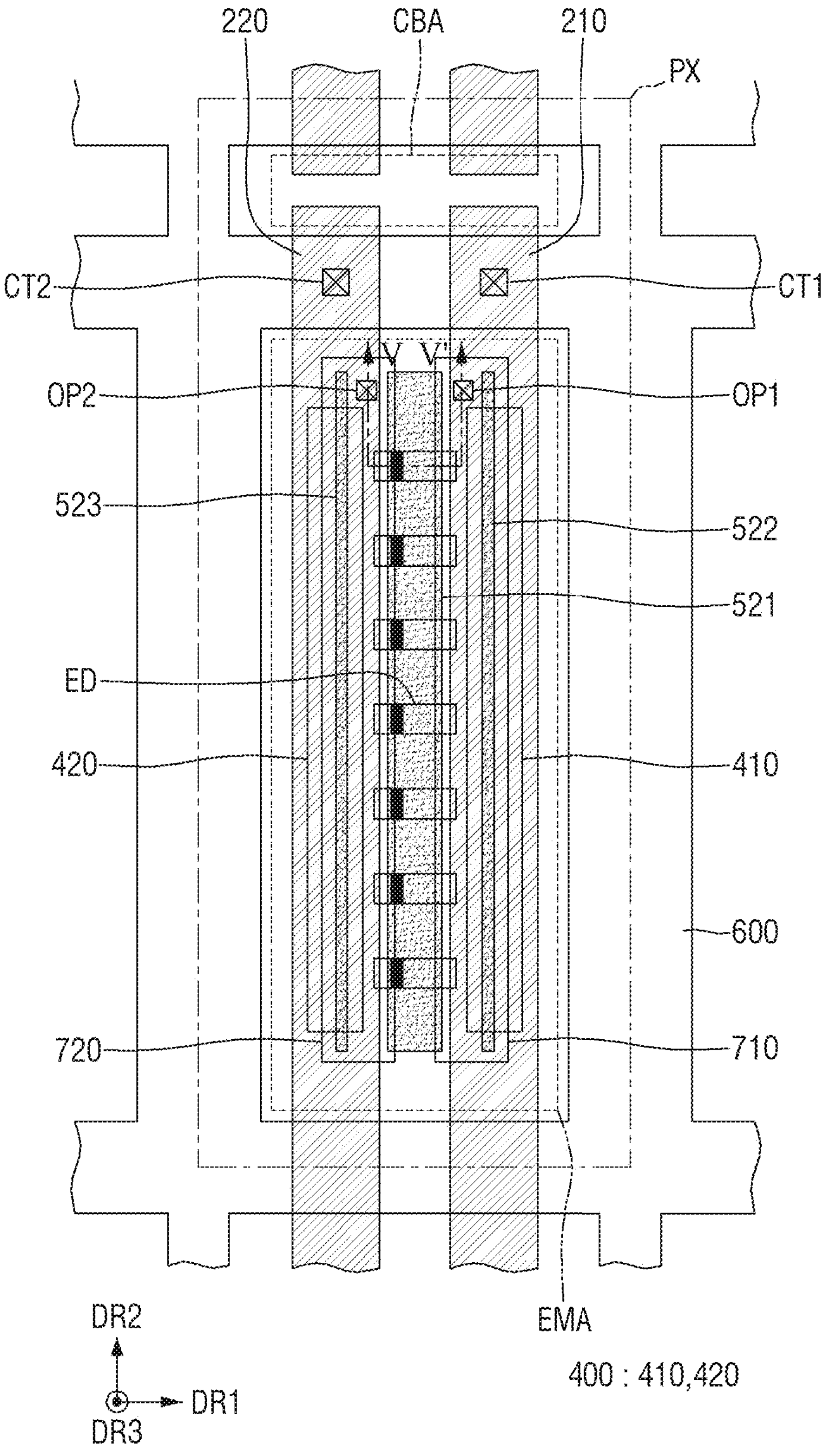
FIG. 2 is a plan view illustrating one pixel of the display device according to one or more embodiments.

FIG. 2 is a plan view illustrating one pixel of the display device of FIG. 1 according to one or more embodiments.

Referring to FIG. 2, each pixel PX of the display device 10 may include an emission area EMA and a non-emission area. The emission area EMA may be defined as an area in which light from light emitting elements ED is emitted, and the non-emission area may be defined as an area in which the light emitted from the light emitting elements ED does not arrive and thus, the light is not emitted.

The emission area EMA may include an area in which the light emitting elements ED are disposed and an area adjacent to the area in which the light emitting elements ED are disposed. In addition, the emission area may further include an area in which the light emitted from the light emitting elements ED is reflected or refracted by other members and then emitted.

Each pixel PX may further include a cutout area CBA disposed in the non-emission area. The cutout area CBA may be disposed on an upper side of the emission area EMA (or one side of the emission area EMA in the second direction DR2) within one pixel PX. The cutout area CBA may be disposed between emission areas EMA of the pixels PX disposed to be neighbors to each other in the second direction DR2.

The cutout area CBA may be an area in which electrodes 210 and 220 included in the respective pixels PX neighboring to each other along the second direction DR2 are separated from each other. The electrodes 210 and 220 disposed in each pixel PX may be separated from each other in the cutout area CBA, and portions of the electrodes 210 and 220 disposed in each pixel PX may be disposed in the cutout area CBA. The light emitting elements ED may not be disposed in the cutout area CBA.

Figure 3:
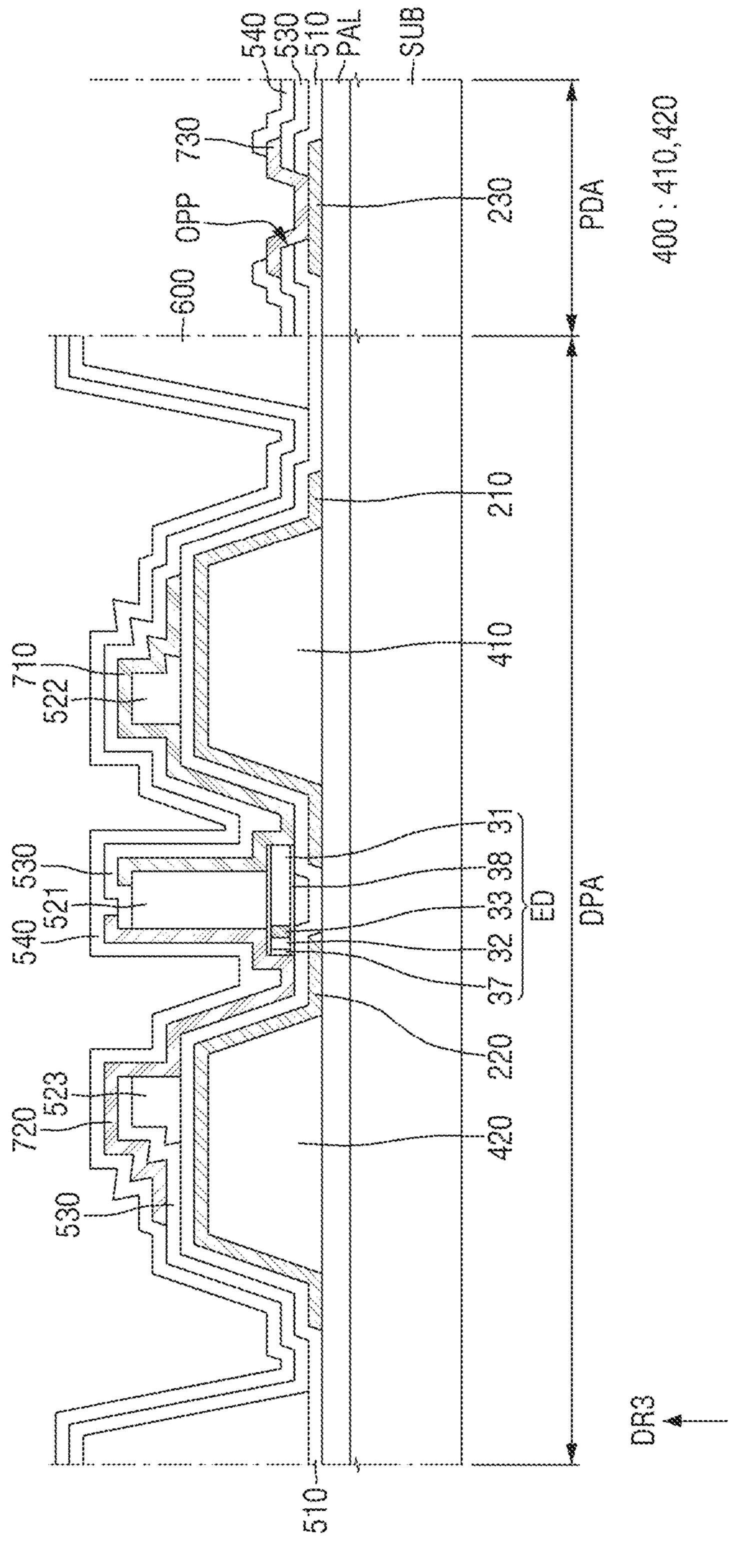
FIG. 3 is a schematic cross-sectional view of a display area and a pad area of the display device according to one or more embodiments.
Figure 4:
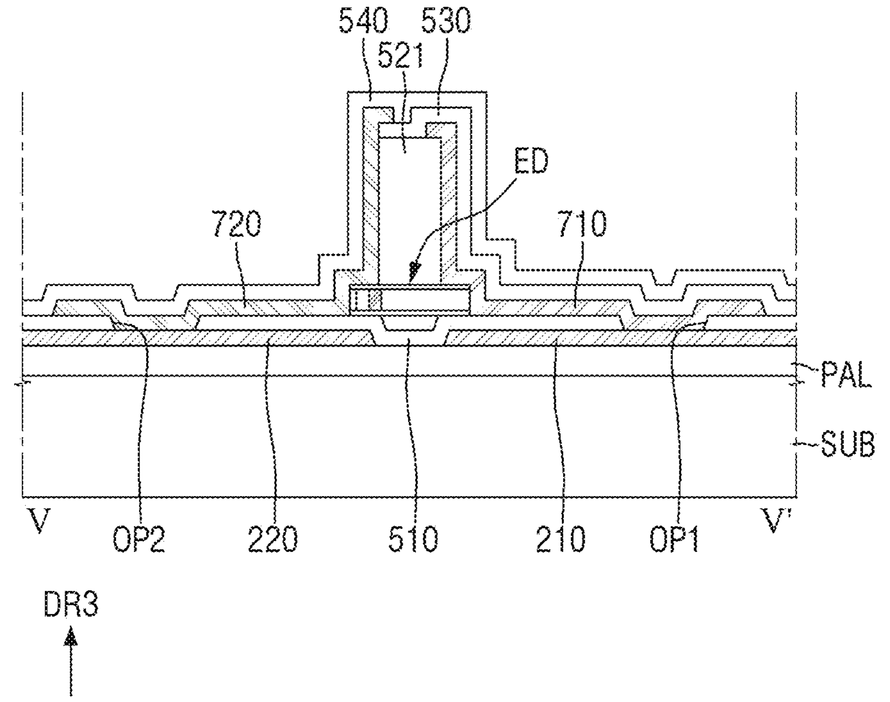
FIG. 4 is a cross-sectional view illustrating an example taken along the line V-V' of FIG. 2.

FIG. 3 is a schematic cross-sectional view of a display area and a pad area of the display device according to one or more embodiments. FIG. 4 is a cross-sectional view illustrating an example taken along the line V-V' of FIG. 2.

In FIG. 3, cross sections of a portion of the display area DPA and a portion of the non-display area NDA have been illustrated together. Cross sections of the emission area EMA included in one pixel PX and its adjacent area have been illustrated as the cross section of the display area DPA, and a cross section of a pad area PDA has been illustrated as the cross section of the non-display area NDA. In FIG. 4, a cross section of an area in which first and second contact electrodes 710 and 720 and first and second electrodes 210 and 220 are in contact with each other in the emission area EMA included in one pixel PX of the display area DPA has been illustrated.

Referring to FIGS. 2 to 4, the display device 10 may include a substrate SUB, a circuit element layer PAL disposed on the substrate SUB, a light emitting element layer disposed on the circuit element layer PAL in the display area DPA and including a plurality of light emitting elements ED, and a pad part disposed on the circuit element layer PAL in the pad area PDA and including a pad electrode 730.

The substrate SUB may be an insulating substrate. The substrate SUB may be made of an insulating material such as glass, quartz, or a polymer resin. The substrate SUB may be a rigid substrate, but may also be a flexible substrate capable of being bent, folded, or rolled.

The circuit element layer PAL may be disposed on the substrate SUB. In one or more embodiments, the circuit element layer PAL may include at least one transistor and the like disposed in the display area DPA to drive the light emitting element layer. In addition, the circuit element layer PAL may include a wiring pad disposed in the pad area PDA to be connected to the external device EXD (see FIG. 1) mounted on the circuit element layer PAL through a connection electrode 230 and a pad electrode 730 to be described later.

A first bank 400 may be disposed on the circuit element layer PAL. The first bank 400 may be disposed in the display area DPA. The first bank 400 may have a shape in which it extends in the second direction DR2 within the emission area EMA of each pixel PX in a plan view.

The first bank 400 may include a first sub-bank 410 and a second sub-bank 420 disposed to be spaced from each other. In one or more embodiments, the first sub-bank 410 and the second sub-bank 420 may be disposed to be spaced from and oppose each other in the first direction DR1.

The first and second sub-banks 410 and 420 may have a structure in which at least portions thereof protrude from an upper surface of the substrate SUB. The protruding portions of the first and second sub-banks 410 and 420 may have inclined side surfaces. The first and second sub-banks 410 and 420 may have the inclined surfaces to serve to change a traveling direction of light emitted from the light emitting elements ED and traveling toward the side surfaces of the first and second sub-banks 410 and 420 into an upward direction (e.g., a display direction).

The first electrode 210 and the second electrode 220 may be disposed on the first bank 400. The first electrode 210 may be disposed on the first sub-bank 410, and the second electrode 220 may be disposed on the second sub-bank 420.

Each of the first electrode 210 and the second electrode 220 may have a shape in which it extends in the second direction DR2 in a plan view. The first electrode 210 and the second electrode 220 may be disposed to be spaced from and oppose each other in the first direction DR1.

The first electrode 210 may extend in the second direction DR2 in a plan view so as to overlap a partial area of a second bank 600 extending in the first direction DR1. The first electrode 210 may be electrically connected to the circuit element layer PAL through a first contact hole CT1.

The second electrode 220 may extend in the second direction DR2 in a plan view so as to overlap a partial area of a second bank 600 extending in the first direction DR1. The second electrode 220 may be electrically connected to the circuit element layer PAL through a second contact hole CT2.

The first and second electrodes 210 and 220 may be electrically connected to the light emitting elements ED, respectively, and a suitable voltage (e.g., a set or predetermined voltage) may be applied to the first and second electrodes 21 and 22 so that the light emitting elements ED emit light. For example, a plurality of electrodes 210 and 220 may be electrically connected to the light emitting elements ED disposed on the first electrode 210 and the second electrode 220 in an area between the first electrode 210 and the second electrode 220 through contact electrodes 710 and 720 to be described later, and electrical signals applied to the electrodes 210 and 220 may be transferred to the light emitting elements ED through the contact electrodes 710 and 720.

In addition, alignment signals for forming electric fields used to align the light emitting elements ED in manufacturing processes of the display device 10 may be applied to the first and second electrodes 210 and 220. Specifically, when ink including a plurality of light emitting elements ED is jetted onto the first electrode 210 and the second electrode 220 through an inkjet printing process from among the manufacturing processes of the display device 10, the alignment signals may be applied to the first and second electrodes 210 and 220 to generate electric fields. The plurality of light emitting elements ED included in the ink may be aligned so that both ends thereof are positioned on the first electrode 210 and the second electrode 220 between the first and second electrodes 210 and 220 by receiving a dielectrophoretic force by the electric fields generated between the first and second electrodes 210 and 220.

The first electrode 210 and the second electrode 220 may be separated from first and second electrodes 210 and 220 of pixels PX neighboring in the second direction DR2 in the cutout area CBA in the pixel PX, respectively. A planar shape of the first and second electrodes 210 and 220 separated in the cutout area CBA may be formed through a process of disconnecting the first and second electrodes 210 and 220 in the cutout area CBA after a process of disposing the light emitting elements ED from among the manufacturing processes of the display device 10. However, the present disclosure is not limited thereto, and some of the first and second electrodes 210 and 220 may extend to the pixels PX neighboring in the second direction DR2 to be integrated with the first and second electrodes 210 and 220 of the pixels PX neighboring in the second direction DR2 or only any one of the first electrode 210 or the second electrode 220 may be separated.

The connection electrode 230 may be disposed on the circuit element layer PAL. The connection electrode 230 may be disposed in the pad area PDA. In one or more embodiments, as described above, the circuit element layer PAL may include the wiring pad disposed in the pad area PDA, and the connection electrode 230 may be electrically connected to the wiring pad.

In one or more embodiments, the first electrode 210, the second electrode 220, and the connection electrode 230 may include the same material. The first electrode 210, the second electrode 220, and the connection electrode 230 may be patterned and formed by the same mask process, but are not limited thereto.

A first insulating layer 510 may be disposed in the display area DPA and the pad area PDA. The first insulating layer 510 may be disposed on the plurality of electrodes 210 and 220 and the connection electrode 230.

The first insulating layer 510 may be disposed on the first electrode 210 and the second electrode 220 in the display area DPA. The first insulating layer 510 may be disposed to cover the first electrode 210 and the second electrode 220, and may include a first opening OP1 exposing a portion of the first electrode 210 and a second opening OP2 exposing a portion of the second electrode 220. The first electrode 210 may be in contact with a first contact electrode 710 to be described later through the first opening OP1 penetrating through the first insulating layer 510, and the second electrode 220 may be in contact with a second contact electrode 720 to be described later through the second opening OP2 penetrating through the first insulating layer 510.

The first insulating layer 510 may serve to insulate the first electrode 210 and the second electrode 220 from each other while protecting the first electrode 210 and the second electrode 220. In addition, the first insulating layer 510 may prevent the light emitting elements ED disposed on the first insulating layer 510 from being in direct contact with and being damaged by other members.

The first insulating layer 510 may be disposed in a peripheral area of the connection electrode 230 so as to expose a portion of an upper surface of the connection electrode 230 in the pad area PDA. The first insulating layer 510 may constitute a pad opening OPP exposing the connection electrode 230. An inner sidewall of the pad opening OPP may be disposed to overlap the connection electrode 230.

The first insulating layer 510 may include an inorganic insulating material or an organic insulating material. For example, the first insulating layer 510 may include an inorganic insulating material such as silicon oxide ($SiO_x$), silicon nitride ($SiN_x$), silicon oxynitride ($SiO_xN_y$), aluminum oxide ($Al_2O_3$), or aluminum nitride (AlN). Alternatively, the first insulating layer 510 may include an organic insulating material such as an acrylic resin, an epoxy resin, a phenolic resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or polymethyl methacrylate-polycarbonate synthetic resin. In one or more embodiments, the first insulating layer 510 may include silicon oxide ($SiO_x$), but is not limited thereto.

The second bank 600 may be disposed on the first insulating layer 510. The second bank 600 may be disposed in the display area DPA. The second bank 600 may be disposed in a lattice-shaped pattern in the entirety of the display area DPA by including portions extending in the first direction DR1 and the second direction DR2 in a plan view. The second bank 600 may be disposed across a boundary between the respective pixels PX to divide neighboring pixels PX. The second bank 600 may be disposed to be around (e.g., to surround) an outer portion of the display area DPA, but may not be disposed in the pad area PDA.

The second bank 600 may be formed to have a greater height than the first bank 400. The second bank 600 may serve to prevent ink from overflowing into adjacent pixels PX in the inkjet printing process for aligning the light emitting elements ED from among the manufacturing processes of the display device 10. In addition, the second bank 600 may be disposed to be around (e.g., to surround) the emission area EMA and the cutout area CBA disposed for each pixel PX to divide the emission area EMA and the cutout area CBA. The second bank 600 may be disposed to divide the emission area EMA and the cutout area CBA, and thus, the light emitting elements ED may not be disposed in the cutout area CBA.

In one or more embodiments, the second bank 600 may include an organic insulating material such as polyimide (PI), but is not limited thereto.

The light emitting elements ED may be disposed on the first insulating layer 510. The light emitting elements ED may be disposed in the display area DPA.

The light emitting elements ED may have a shape in which they extend in one direction. An extension direction of the first and second electrodes 210 and 220 and an extension direction of the light emitting elements ED may be substantially perpendicular to each other. However, the present disclosure is not limited thereto, and some of the plurality of light emitting elements ED may be disposed so that an extension direction thereof is substantially perpendicular to an extension direction of the first and second electrodes 210 and 220, and the others of the plurality of light emitting elements ED may be disposed so that an extension direction thereof is oblique to the extension direction of the first and second electrodes 210 and 220.

The light emitting elements ED may have respective ends disposed on the first electrode 210 and the second electrode 220, between the first sub-bank 410 and the second sub-bank 420. Specifically, the light emitting elements ED may be disposed on respective one ends of the first electrode 210 and the second electrode 220 that are spaced from and opposing each other. Hereinafter, in the present disclosure, for convenience of explanation, respective ends of the first electrode 210 and the second electrode 220 opposing each other (that is, ends of the respective electrodes facing inward in the emission area EMA) will be referred to as one ends of the first electrode 210 and the second electrode 220, and ends of the first electrode 210 and the second electrode 220 opposite to the one ends (that is, ends of the respective electrodes facing outward in the emission area EMA) will be referred to as the other ends of the first electrode 210 and the second electrode 220.

An extension length of the light emitting elements ED may be greater than an interval between the first electrode 210 and the second electrode 220. Accordingly, the light emitting elements ED may be disposed on the first electrode 210 and the second electrode 220 so that one ends thereof are on the first electrode 210 (specifically, one end of the first electrode 210) and the other ends thereof are on the second electrode 220 (specifically, one end of the second electrode 220).

A first insulating pattern 521 may be disposed between the first electrode 210 and the second electrode 220 in the emission area EMA. The first insulating pattern 521 may have a shape in which it extends in the second direction DR2 in a plan view. The first insulating pattern 521 may form a linear or island-shaped pattern in the emission area EMA of each pixel PX.

At least portions of the first insulating pattern 521 may be disposed on the light emitting elements ED. The first insulating pattern 521 may be partially disposed on the light emitting elements ED between the first electrode 210 and the second electrode 220. The first insulating pattern 521 may be disposed to partially be around (e.g., to surround) outer surfaces (e.g., outer peripheral or circumferential surfaces) of the light emitting elements ED. The first insulating pattern 521 may be disposed on the light emitting elements ED, but may expose both ends of the light emitting elements ED.

The first insulating pattern 521 may serve to fix the light emitting elements ED in the manufacturing processes of the display device 10 while protecting the light emitting elements ED. In one or more embodiments, in order to stably fix the light emitting elements ED, a thickness of the first insulating pattern 521 may be greater than a diameter of the light emitting elements ED.

A second insulating pattern 522 may be disposed to be spaced from the first insulating pattern 521 in the first direction DR1. The second insulating pattern 522 may have a shape in which it extends in the second direction DR2 in a plan view. The second insulating pattern 522 may form a linear or island-shaped pattern in the emission area EMA of each pixel PX.

The second insulating pattern 522 may be disposed on the first insulating layer 510 in the emission area EMA. The second insulating pattern 522 may be disposed to overlap the first electrode 210 in the third direction DR3. A width of the second insulating pattern 522 in the first direction DR1 may be smaller than a width of the first electrode 210 in the first direction DR1. Accordingly, the second insulating pattern 522 may not overlap both ends of the first electrode 210 in the third direction DR3. The second insulating pattern 522 may not overlap the inclined side surfaces of the first sub-bank 410 in the third direction DR3. However, the present disclosure is not limited thereto, and the second insulating pattern 522 may at least partially overlap the inclined side surfaces of the first sub-bank 410 in the third direction DR3.

Cross-sectional shapes of one side surface of the second insulating pattern 522 opposing the first insulating pattern 521 and the other side surface of the second insulating pattern 522 may be different from each other. For example, one side surface of the second insulating pattern 522 may be formed to be substantially parallel to the first insulating pattern 521 to be formed as a single flat surface or curved surface, but the other side surface of the second insulating pattern 522 may have a shape in which it protrudes outward of the emission area EMA. Such a cross-sectional shape of the second insulating pattern 522 may be a shape formed by a deposition process using a shadow mask.

A third insulating pattern 523 may be disposed to be spaced from the first insulating pattern 521 and the second insulating pattern 522 in the first direction DR1. The first insulating pattern 521 may be disposed between the second insulating pattern 522 and the third insulating pattern 523 in a plan view. The third insulating pattern 523 may have a shape in which it extends in the second direction DR2 in a plan view. The third insulating pattern 523 may form a linear or island-shaped pattern in the emission area EMA of each pixel PX.

The third insulating pattern 523 may be disposed on the first insulating layer 510 in the emission area EMA. The third insulating pattern 523 may be disposed to overlap the second electrode 220 in the third direction DR3. A width of the third insulating pattern 523 in the first direction DR1 may be smaller than a width of the second electrode 220 in the first direction DR1. Accordingly, the third insulating pattern 523 may not overlap both ends of the second electrode 220 in the third direction DR3. The third insulating pattern 523 may not overlap the inclined side surfaces of the second sub-bank 420 in the third direction DR3. However, the present disclosure is not limited thereto, and the third insulating pattern 523 may at least partially overlap the inclined side surfaces of the second sub-bank 420 in the third direction DR3.

Similar to the second insulating pattern 522, cross-sectional shapes of one side surface of the third insulating pattern 523 opposing the first insulating pattern 521 and the other side surface of the third insulating pattern 523 may be different from each other. For example, one side surface of the third insulating pattern 523 may be formed to be substantially parallel to the first insulating pattern to be formed as a single flat surface or curved surface, but the other side surface of the third insulating pattern 523 may have a shape in which it protrudes outward of the emission area EMA. Such a cross-sectional shape of the third insulating pattern 523 may be a shape formed by a deposition process using a shadow mask.

The first to third insulating patterns 521, 522, and 523 may not overlap the first and second openings OP1 and OP2 in the third direction DR3.

The first to third insulating patterns 521, 522, and 523 may include the same material. In one or more embodiments, the first to third insulating patterns 521, 522, and 523 may be patterned and deposited as one insulating pattern material layer 520 (see FIG. 11) through the same process, and may be formed to be spaced from each other by a subsequent process (e.g., an etching process). The second and third insulating patterns 522 and 523 may be residual patterns remaining without being etched due to a mask pattern disposed thereon in an etching process of an insulating pattern material layer 520 for forming an area for bringing contact electrodes 710 and 720 to be described later and the light emitting elements ED into contact with each other. A detailed description thereof will be provided later.

A thickness of the first insulating pattern 521 may be greater than a thickness of the second and third insulating patterns 522 and 523. A width of the first insulating pattern 521 in the first direction DR1 may be greater than a width of the second and third insulating patterns 522 and 523 in the first direction DR1. However, the present disclosure is not limited thereto, and a thickness of the first insulating pattern 521 may also be the same as a thickness of the second and third insulating patterns 522 and 523.

The first contact electrode 710 may be disposed on the first insulating layer 510. The first contact electrode 710 may be disposed in the display area DPA. The first contact electrode 710 may be disposed on the first sub-bank 410 and the first electrode 210.

The first contact electrode 710 may have a shape in which it extends in the second direction DR2 in a plan view. The first contact electrode 710 may form a linear or island-shaped pattern in the emission area EMA of each pixel PX.

The first contact electrode 710 may be in contact with one ends of the light emitting elements ED and the first electrode 210. Specifically, a partial area of the first contact electrode 710 may be in contact with one ends of the light emitting elements ED exposed by the first insulating pattern 521. In addition, another partial area of the first contact electrode 710 may be in contact with an upper surface of the first electrode 210 exposed by the first opening OP1 formed in the first insulating layer 510. That is, the first contact electrode 710 may be in contact with one ends of the light emitting elements ED and the first electrode 210, such that the light emitting elements ED and the first electrode 210 may be electrically connected to each other.

The first contact electrode 710 may be disposed to at least partially cover the second insulating pattern 522 disposed on the first electrode 210. It has been illustrated in the drawings that the first contact electrode 710 is disposed to completely cover the second insulating pattern 522 disposed on the first electrode 210, but the present disclosure is not limited thereto. The first contact electrode 710 may overlap the second insulating pattern 522 in the third direction DR3. The first contact electrode 710 may be disposed to extend from one ends of the light emitting elements ED toward the first insulating pattern 521 to cover a portion of the first insulating pattern 521.

A second insulating layer 530 may be disposed in the display area DPA and the pad area PDA. The second insulating layer 530 may be entirely disposed except in an area other than a space in which the first insulating pattern 521 and the third insulating pattern 523 oppose each other, in the display area DPA. The second insulating layer 530 may be disposed in a peripheral area of the connection electrode 230 so as to expose the connection electrode 230.

The second insulating layer 530 may not be disposed in the space in which the first insulating pattern 521 and the third insulating pattern 523 oppose each other.

The second insulating layer 530 may be disposed on the first contact electrode 710 and the third insulating pattern 523 in the display area DPA. The second insulating layer 530 may extend outward on the first contact electrode 710 and the third insulating pattern 523 to be also disposed on the first sub-bank 410 and the second bank 600. Side surfaces of the second insulating layer 530 may be aligned with side surfaces of the first insulating pattern 521 and the third insulating pattern 523 opposing each other, respectively.

The second insulating layer 530 may electrically insulate the first contact electrode 710 and the second contact electrode 720 from each other. The second insulating layer 530 may be disposed to cover the first contact electrode 710, but may not be disposed on the other ends of the light emitting elements ED so that the light emitting elements ED may be in contact with the second contact electrode 720.

The second insulating layer 530 may be disposed in the peripheral area of the connection electrode 230 so as to expose a portion of the upper surface of the connection electrode 230 in the pad area PDA. The second insulating layer 530 may constitute the pad opening OPP exposing the connection electrode 230. The inner sidewall of the pad opening OPP may be disposed to overlap the connection electrode 230. In the pad area PDA, the second insulating layer 530 and the first insulating layer 510 may constitute the pad opening OPP. The inner sidewalls of the second insulating layer 530 and the first insulating layer 510 constituting the pad opening OPP may be aligned with each other.

The second contact electrode 720 may be disposed on the second insulating layer 530. The second contact electrode 720 may be disposed in the display area DPA. The second contact electrode 720 may be disposed on the second sub-bank 420 and the second electrode 210.

The second contact electrode 720 may have a shape in which it extends in the second direction DR2 in a plan view. The second contact electrode 720 may form a linear or island-shaped pattern in the emission area EMA of each pixel PX. The second contact electrode 720 may be disposed to be spaced from the first contact electrode 710 in the first direction DR1 in a plan view.

The second contact electrode 720 may be in contact with the other ends of the light emitting elements ED and the second electrode 220. Specifically, a partial area of the second contact electrode 720 may be in contact with the other ends of the light emitting elements ED exposed by the first insulating pattern 521. In addition, another partial area of the second contact electrode 720 may be in contact with an upper surface of the second electrode 220 exposed by the second opening OP2 formed in the first insulating layer 510. That is, the second contact electrode 720 may be in contact with the other ends of the light emitting elements ED and the second electrode 220 to electrically connect the other ends of the light emitting elements ED and the second electrode 220 to each other.

The second contact electrode 720 may be disposed to at least partially cover the third insulating pattern 523 disposed on the second electrode 220. It has been illustrated in the drawings that the second contact electrode 720 is disposed to completely cover the third insulating pattern 523 disposed on the second electrode 220, but the present disclosure is not limited thereto. The second contact electrode 720 may overlap the third insulating pattern 523 in the third direction DR3. The second contact electrode 720 may be disposed to extend from the other ends of the light emitting elements ED toward the first insulating pattern 521 to cover portions of the first insulating pattern 521 and the second insulating layer 530. The first contact electrode 710 and the second contact electrode 720 may be insulated from each other by the second insulating layer 530.

The pad electrode 730 may be disposed in the pad area PDA. The pad electrode 730 may be disposed on the second insulating layer 530. The pad electrode 730 may be in direct contact with the upper surface of the connection electrode 230 through the pad opening OPP. The pad electrode 730 may include the same material as the second contact electrode 720. In one or more embodiments, the pad electrode 730 may be formed through the same process as the second contact electrode 720.

A third insulating layer 540 may be entirely disposed on the substrate SUB. The third insulating layer 540 may serve to protect members disposed on the substrate SUB from an external environment.

Figure 5:
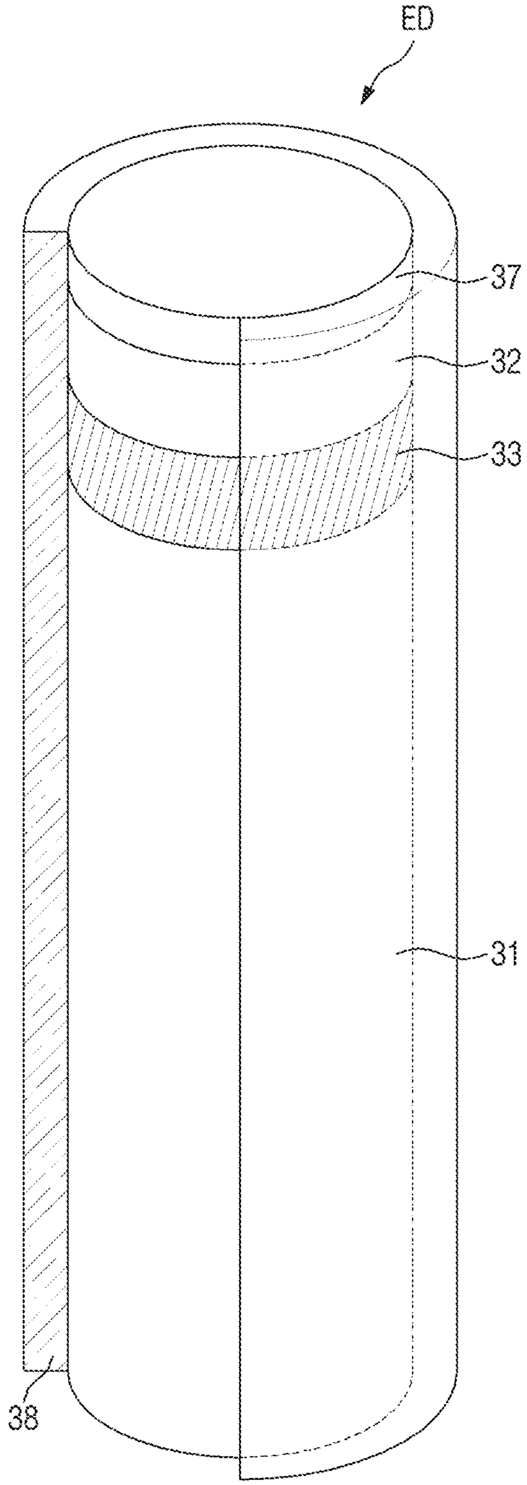
FIG. 5 is a schematic cutaway view of a light emitting element according to one or more embodiments.

FIG. 5 is a schematic cutaway view of a light emitting element according to one or more embodiments.

Referring to FIG. 5, the light emitting element ED is a particle-type element, and may have a rod shape or a cylindrical shape having a suitable aspect ratio (e.g., a predetermined aspect ratio). A length of the light emitting element ED may be greater than a diameter of the light emitting element ED, and the aspect ratio of the light emitting element ED may be 1.2:1 to 100:1, but the present disclosure is not limited thereto.

The light emitting element ED may have a size of a nanometer scale (1 nm or more and less than 1 μm) to a micrometer scale (1 μm or more and less than 1 mm). In one or more embodiments, both the length and the diameter of the light emitting element ED may have a size of a nanometer scale or have a size of a micrometer scale. In one or more embodiments, the diameter of the light emitting element ED may have a size of a nanometer scale, while the length of the light emitting element ED may have a size of a micrometer scale. In one or more embodiments, diameters and/or lengths of some of the light emitting elements ED may have sizes of a nanometer scale, while diameters and/or lengths of the other ones of the light emitting elements ED may have a size of a micrometer scale.

The light emitting element ED may include an inorganic light emitting diode. The inorganic light emitting diode may include a plurality of semiconductor layers. For example, the inorganic light emitting diode may include a first conductivity-type (e.g., n-type) semiconductor layer, a second conductivity-type (e.g., p-type) semiconductor layer, and an active semiconductor layer interposed between the first conductivity-type semiconductor layer and the second conductivity-type semiconductor layer. The active semiconductor layer may receive holes and electrons provided from the first conductivity-type semiconductor layer and the second conductivity-type semiconductor layer, respectively, and the holes and the electrons reaching the active semiconductor layer may be combined with each other to emit light.

In one or more embodiments, the above-described semiconductor layers may be sequentially stacked along a length direction of the light emitting element ED. The light emitting element ED may include a first semiconductor layer 31, an active layer 33, and a second semiconductor layer 32 that are sequentially stacked in the length direction, as illustrated in FIG. 5. The first semiconductor layer 31, the active layer 33, and the second semiconductor layer 32 may be the above-described first conductivity-type semiconductor layer, active semiconductor layer, and second conductivity-type semiconductor layer, respectively.

The first semiconductor layer 31 may be doped with a first conductivity-type dopant. The first conductivity-type dopant may be Si, Ge, Sn, or the like. In one or more embodiments, the first semiconductor layer 31 may be made of n-GaN doped with n-type Si.

The second semiconductor layer 32 may be disposed to be spaced from the first semiconductor layer 31 with the active layer 33 interposed therebetween. The second semiconductor layer 32 may be doped with a second conductivity-type dopant such as Mg, Zn, Ca, Se, or Ba. In one or more embodiments, the second semiconductor layer 32 may be made of p-GaN doped with p-type Mg.

The active layer 33 may include a material having a single or multiple quantum well structure. As described above, the active layer 33 may emit light by a combination of electron-hole pairs according to an electrical signal applied through the first semiconductor layer 31 and the second semiconductor layer 32.

In one or more embodiments, the active layer 33 may have a structure in which semiconductor materials having large band gap energy and semiconductor materials having small band gap energy are alternately stacked, and may include other Group III to Group V semiconductor materials depending on a wavelength band of emitted light.

The light emitted from the active layer 33 may be emitted not only to outer surfaces of the light emitting element ED in the length direction, but also to both sides of the light emitting element ED. That is, an emission direction of the light from the active layer 33 is not limited to one direction.

The light emitting element ED may further include an electrode layer 37 disposed on the second semiconductor layer 32. The electrode layer 37 may be in contact with the second semiconductor layer 32. The electrode layer 37 may be an ohmic contact electrode, but is not limited thereto, and may also be a Schottky contact electrode.

The electrode layer 37 may be disposed between the second semiconductor layer 32 and an electrode to serve to decrease resistance, when both ends of the light emitting element ED and electrodes (e.g., contact electrodes of the display device or first and second probes of an optical inspection device) are electrically connected to each other, respectively, in order to apply an electrical signal to the first semiconductor layer 31 and the second semiconductor layer 32. The electrode layer 37 may include at least one of aluminum (Al), titanium (Ti), indium (In), gold (Au), silver (Ag), indium tin oxide (ITO), indium zinc oxide (IZO), or indium tin zinc oxide (ITZO). The electrode layer 37 may also include an n-type or p-type doped semiconductor material.

The light emitting element ED may further include an insulating film 38 surrounding outer surfaces (e.g., outer peripheral or circumferential surfaces) of the first semiconductor layer 31, the second semiconductor layer 32, the active layer 33, and/or the electrode layer 37. The insulating film 38 may be disposed to surround at least an outer surface (e.g., an outer peripheral or circumferential surface) of the active layer 33, and may extend in one direction in which the light emitting element ED extends. The insulating film 38 may serve to protect these members. The insulating film 38 may be made of materials having insulating properties to prevent an electrical short-circuit that may occur when the active layer 33 is in direct contact with an electrode through which an electrical signal is transferred to the light emitting element ED. In addition, the insulating film 38 protects the outer surfaces (e.g., the outer peripheral or circumferential surfaces) of the first and second semiconductor layers 31 and 32 as well as the active layer 33, and may thus prevent a decrease in luminous efficiency.

Hereinafter, manufacturing processes of the display device 10 will be described with reference to other drawings.

FIGS. 6 to 28 are cross-sectional views and plan layout views of manufacturing process steps of the display device according to one or more embodiments.

Figure 6:
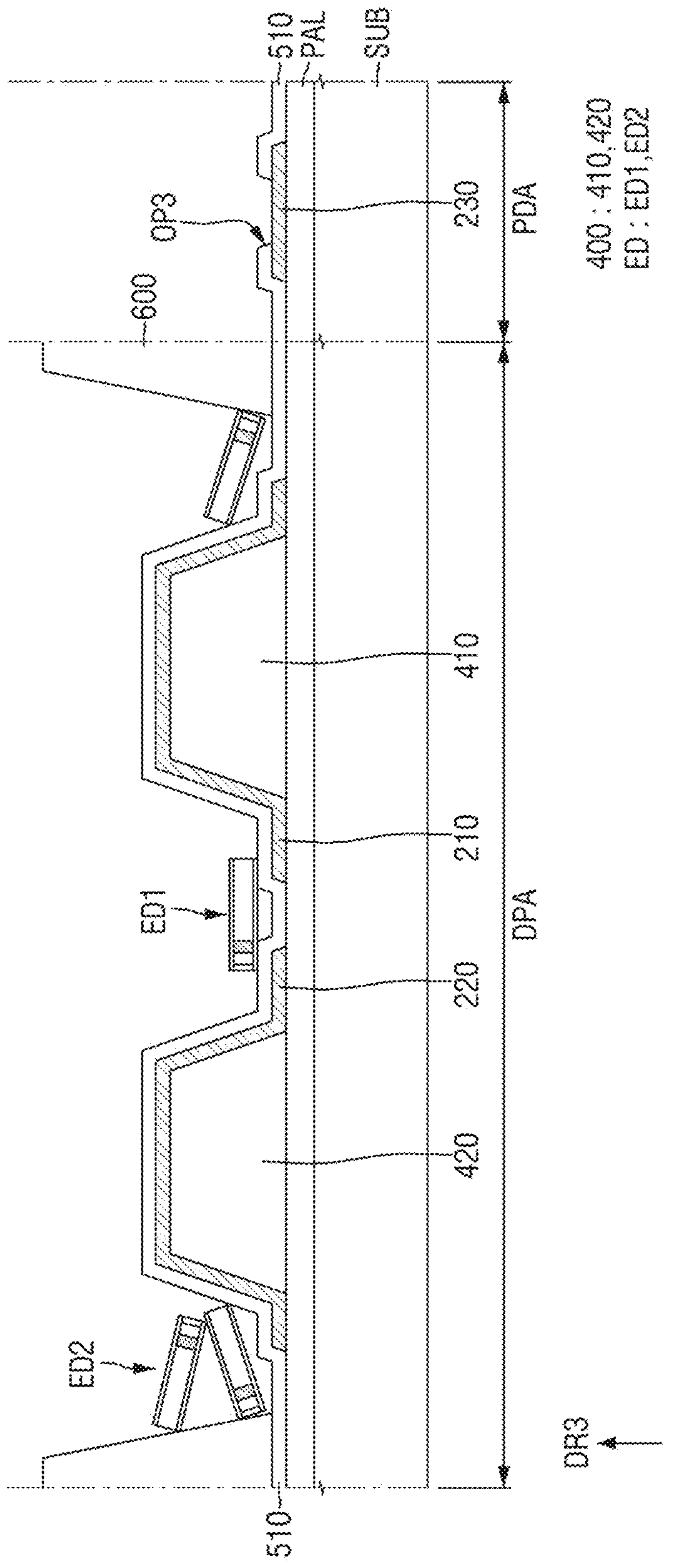
FIGS. 6 to 28 are cross-sectional views and plan views of manufacturing process steps of the display device according to one or more embodiments.
Figure 7:
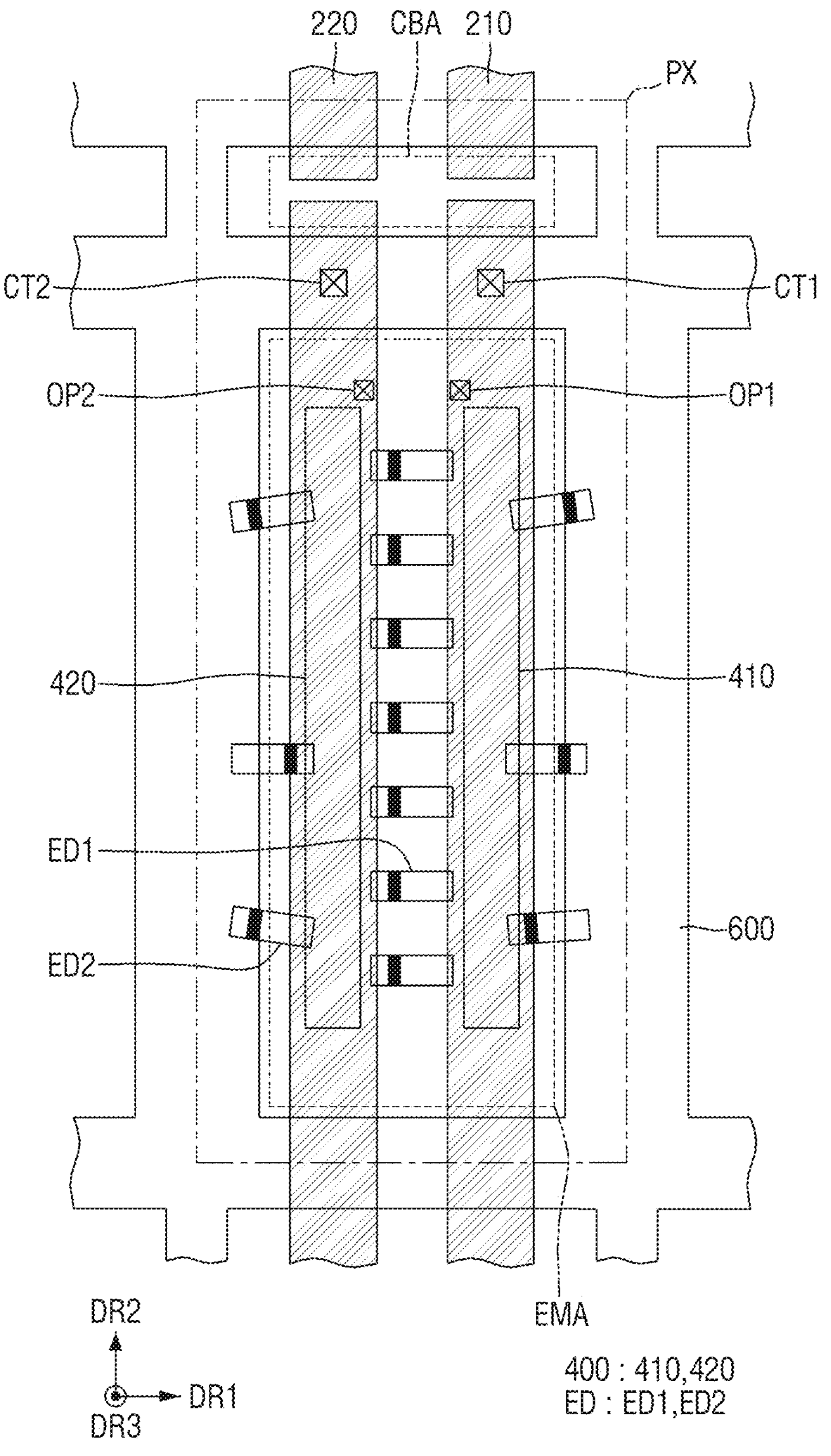

Referring to FIGS. 6 and 7, first, the circuit element layer PAL is formed on the substrate SUB, and the first bank 400 including the first sub-bank 410 and the second sub-bank 420 are formed on the circuit element layer PAL. Next, the first electrode 210 and the second electrode 220 are formed respectively on the first sub-bank 410 and the second sub-bank 420 in the display area DPA, and the connection electrode 230 is formed on the circuit element layer PAL in the pad area PDA. The first electrode 210, the second electrode 220, and the connection electrode 230 may include the same material, and may thus be concurrently (e.g., simultaneously) formed in the same process.

Next, the first insulating layer 510 including the first opening OP1 and the second opening OP2 exposing the first electrode 210 and the second electrode 220, respectively, in the emission area EMA and a third opening OP3 exposing a portion of the connection electrode 230 in the pad area PDA is formed on the first insulating layer 510.

Next, the second bank 600 is formed on the first insulating layer 510, and a plurality of light emitting elements ED are then disposed in the emission area EMA partitioned by the second bank 600. The plurality of light emitting elements ED may include first light emitting elements ED1 of which respective ends are disposed on the first electrode 210 and the second electrode 220, and second light emitting elements ED2 of which at least one of both ends is not disposed on the first electrode 210 or the second electrode 220.

In one or more embodiments, the plurality of light emitting elements ED may be jetted onto a target substrate SUB in a state in which they are dispersed in ink. In one or more embodiments, the light emitting element ED may be prepared in a state in which they are dispersed in the ink and may be jetted onto the target substrate SUB by a printing process using an inkjet printing device. The ink jetted through the inkjet printing device may be seated in an area surrounded by the second bank 600. The second bank 600 may prevent the ink from overflowing into other neighboring pixels PX.

When the ink including the light emitting elements ED is jetted, electrical signals may be applied to each of the first electrode 210 and the second electrode 220 to align the plurality of light emitting elements ED on the first insulating layer 510. Specifically, the plurality of light emitting elements ED may be aligned so that respective ends thereof are disposed on the first electrode 210 and the second electrode 220. In one or more embodiments, some of the light emitting elements ED included in the jetted ink may be disposed between the first electrode 210 and the second electrode 220, but the other ones of the light emitting elements ED included in the jetted ink may not be disposed between the first electrode 210 and the second electrode 220.

The plurality of light emitting elements ED jetted onto the substrate SUB may include the first light emitting elements ED1 and the second light emitting elements ED2 according to a relative arrangement relationship between both ends of the light emitting elements ED and the first and second electrodes 210 and 220.

The first light emitting elements ED1 of the light emitting elements ED dispersed in the ink and jetted into an area partitioned by the second bank 600 may be light emitting elements of which respective ends are disposed on the first electrode 210 and the second electrode 220, while their orientation directions and positions change by receiving the dielectrophoretic force by the electric fields generated between the first electrode 210 and the second electrode 220.

On the other hand, the second light emitting elements ED2 of the light emitting elements ED dispersed in the ink and jetted into the area partitioned by the second bank 600 may be light emitting elements of which both ends are not disposed on the first electrode 210 and the second electrode 220, or at least one of both ends is not disposed on the first electrode 210 or the second electrode 220. In this case, such second light emitting elements ED2 may be referred to as separated light emitting elements ED. In one or more embodiments, at least one of both ends of the second light emitting elements ED2 is not disposed on the first electrode 210 or the second electrode 220, such that the electrical signals may not be transferred to both ends of the second light emitting elements ED2. That is, the second light emitting elements ED2 may be light emitting elements ED that are disposed in the emission area EMA but do not emit light. In addition, such second light emitting element ED2 may cause a defect of the display device 10 by generating a step by a thickness corresponding to a diameter of the light emitting element ED in a process of forming a plurality of layers disposed on the second light emitting elements ED2. Accordingly, the reliability of the display device 10 may be improved through a process of removing such second light emitting elements ED2, that is, the separated light emitting elements ED2.

Figure 8:
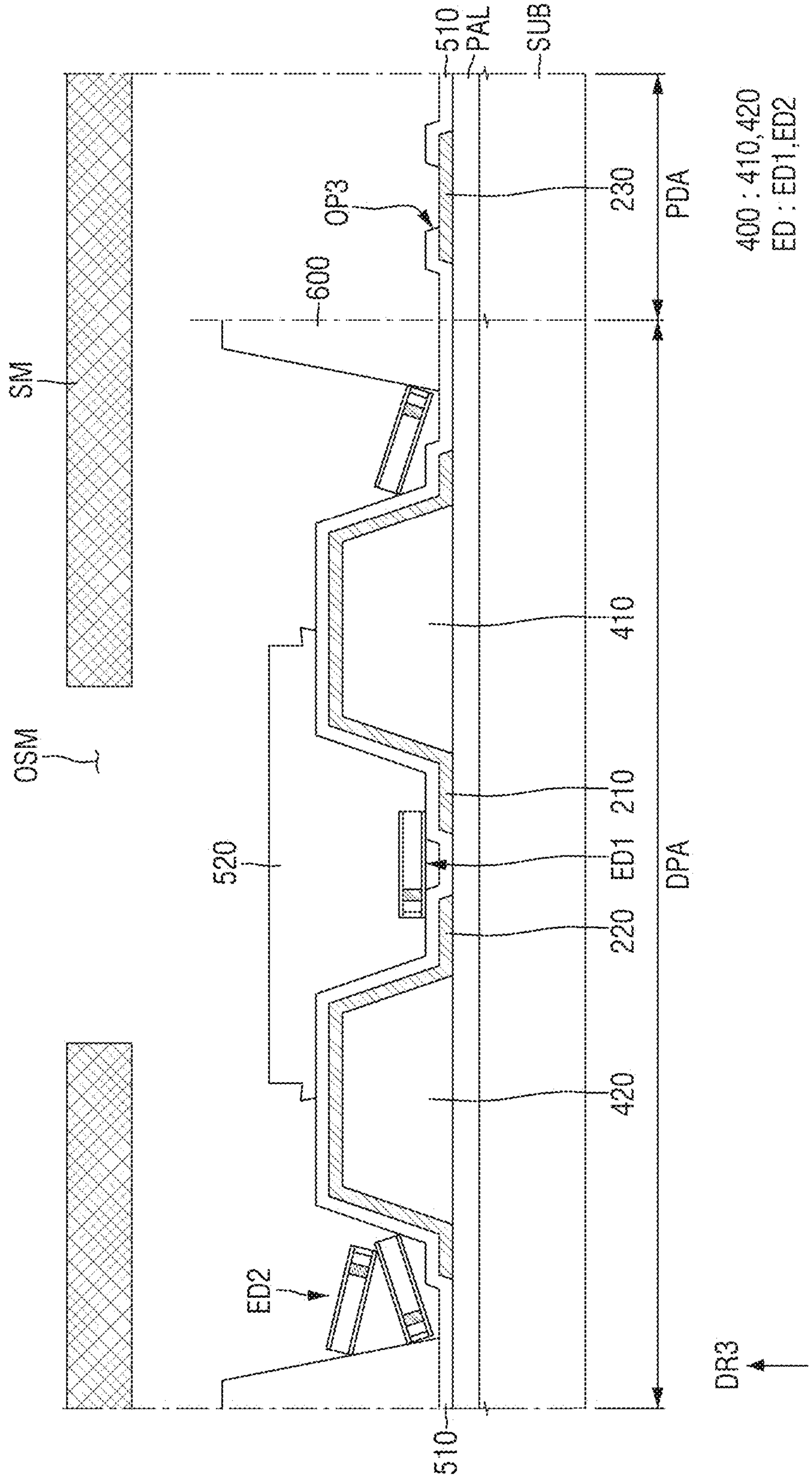
Figure 9:
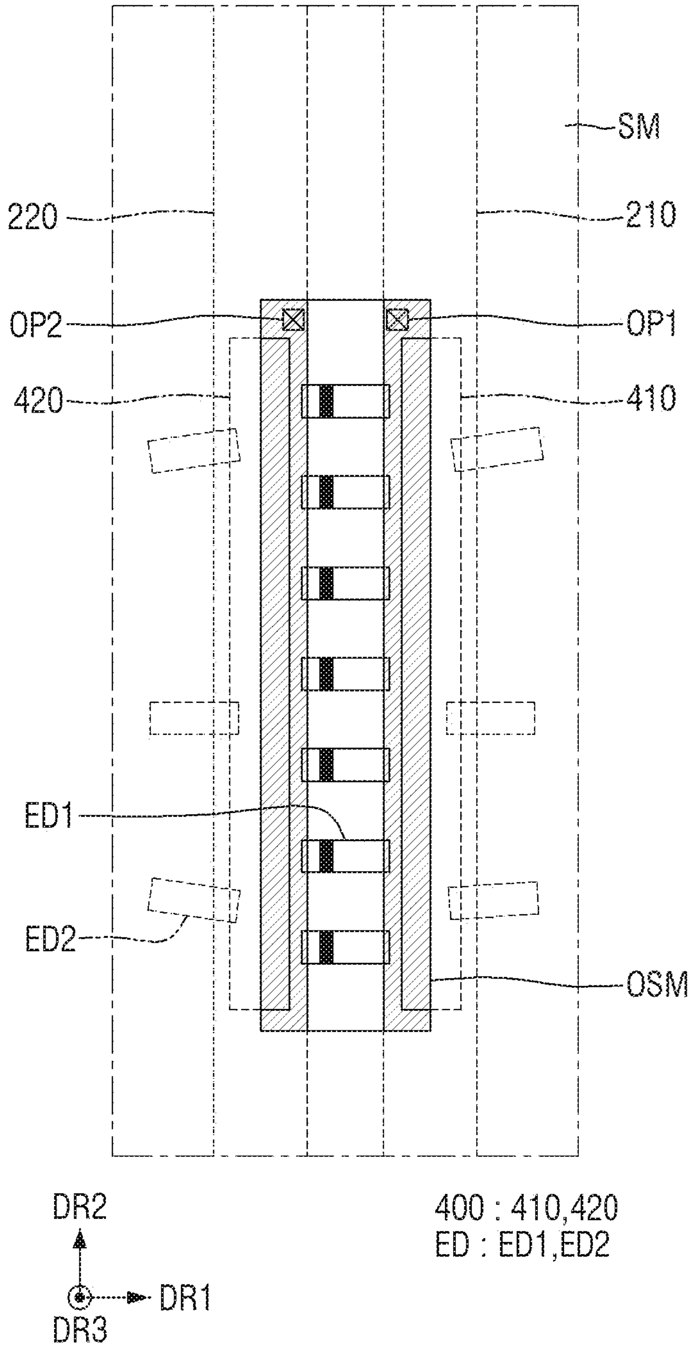

Next, referring to FIGS. 8 and 9, a shadow mask SM may be disposed on the substrate SUB, and a first insulating pattern material layer 520 may be formed using the shadow mask SM. The first insulating pattern material layer 520 may be formed through a deposition process. For example, an opening OSM of the shadow mask SM may be disposed to include one end areas of the first electrode 210 and the second electrode 220 as well as an area between the first electrode 210 and the second electrode 220 in the emission area EMA. That is, the opening OSM of the shadow mask SM may overlap an area in which the first light emitting elements ED1 are disposed in each emission area EMA.

The first insulating pattern material layer 520 formed using the shadow mask SM may be formed on the first insulating layer 510 so as to completely cover the first light emitting elements ED1. The first insulating pattern material layer 520 may be partially deposited even outside the opening OSM of the shadow mask SM by the deposition process using the shadow mask SM. In this case, an outer shape of the first insulating pattern material layer 520 may include a tail shape protruding toward the second bank 600. The first insulating pattern material layer 520 may not cover the second light emitting elements ED2. That is, the first insulating pattern material layer 520 may not overlap the second light emitting elements ED2 in the third direction DR3.

Figure 10:
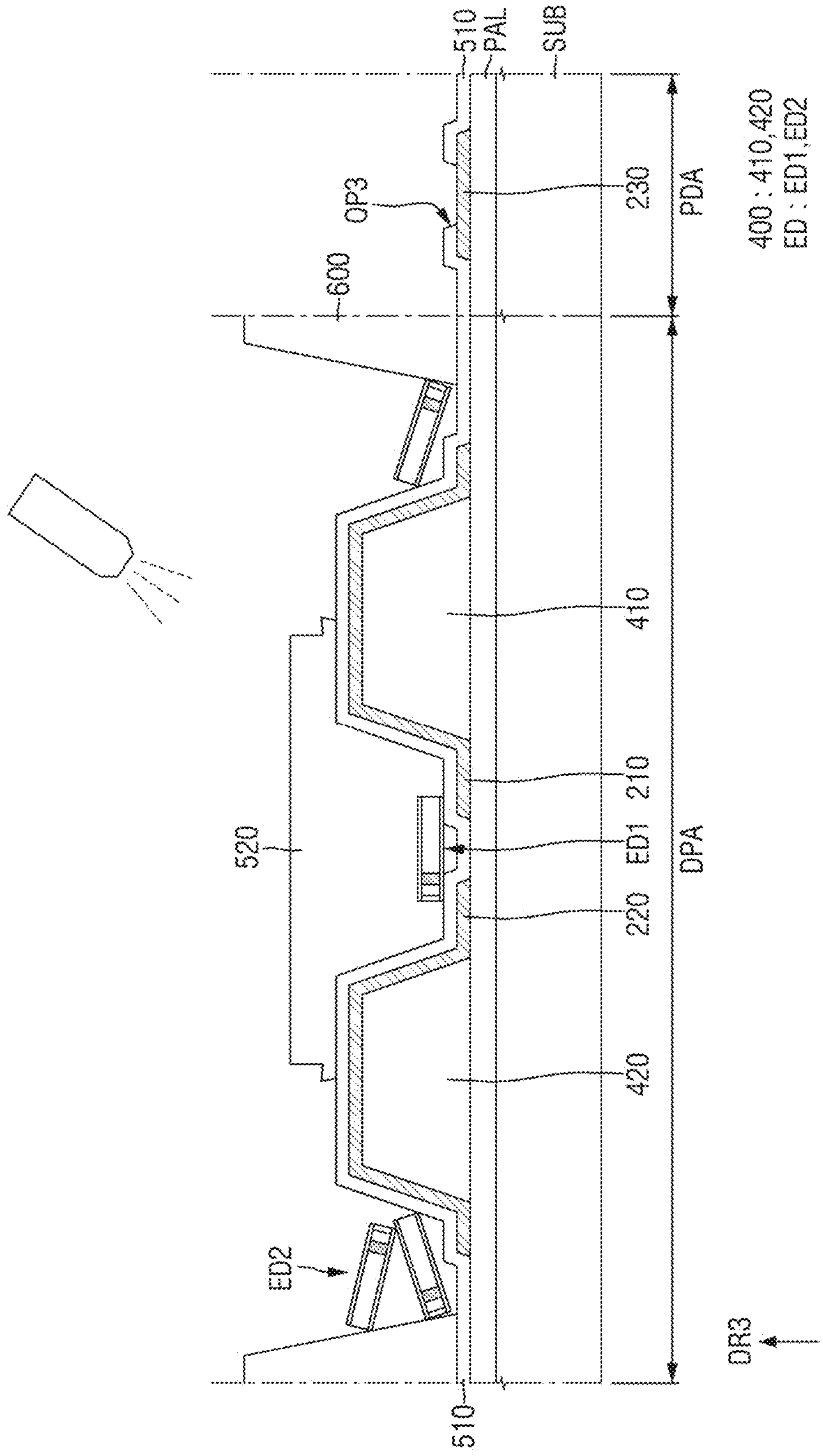

Next, referring to FIG. 10, in a state in which the first insulating pattern material layer 520 is formed on the first light emitting elements ED, a process of removing the second light emitting elements ED2 may be performed. The process of removing the second light emitting elements ED2 may be performed through a liquid treatment process. The liquid treatment process may be replaced with a liquid treatment process of cleaning the substrate SUB after the deposition process is performed using the shadow mask SM without adding a separate process. The first light emitting elements ED1 may be fixed by the first insulating pattern material layer 520 disposed on the first light emitting elements ED1, and thus, may not be removed through the liquid treatment process. On the other hand, the second light emitting elements ED2 may be removed from the substrate SUB by liquid treatment because a layer fixing the second light emitting elements ED2 does not exist on the second light emitting elements ED2. In one or more embodiments, the second light emitting elements ED2 removed from the substrate SUB may be recovered and recycled. Accordingly, the second light emitting elements ED2 are recycled, and thus, a material cost may be reduced.

Figure 11:
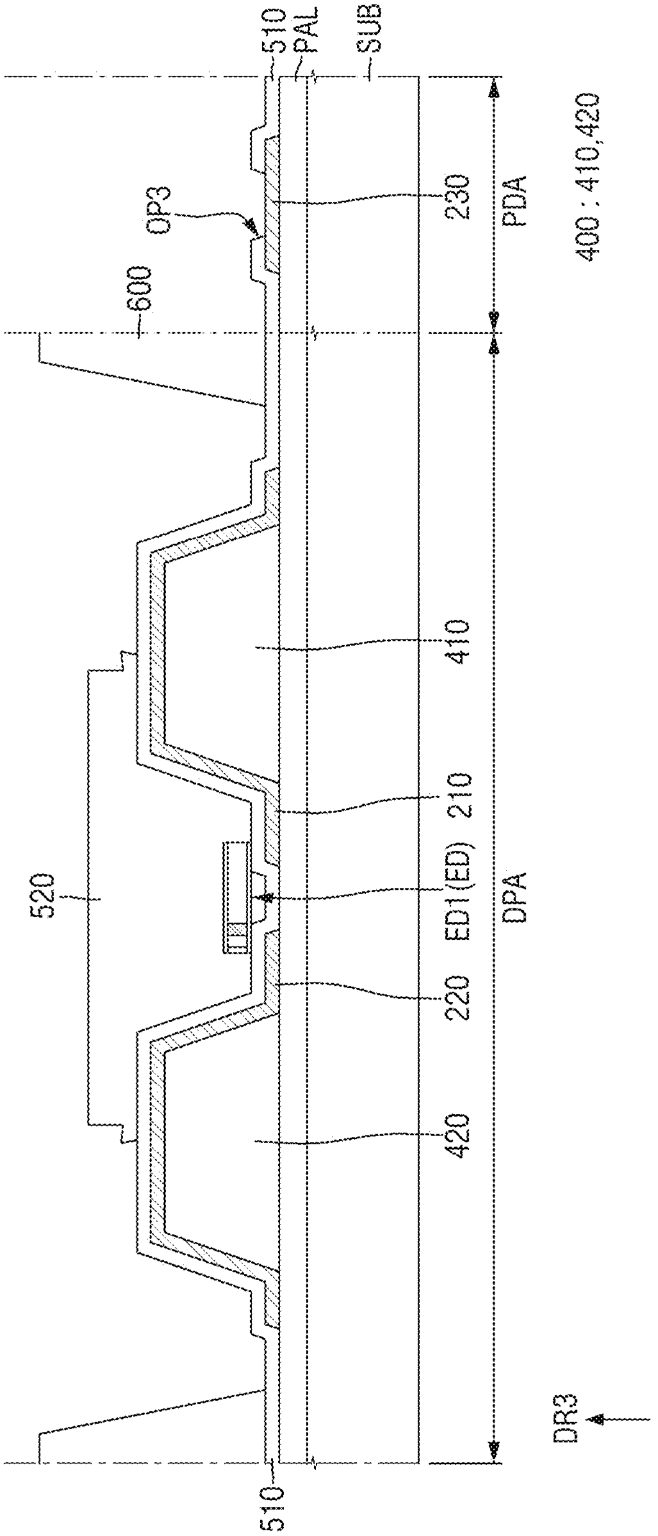
Figure 12:
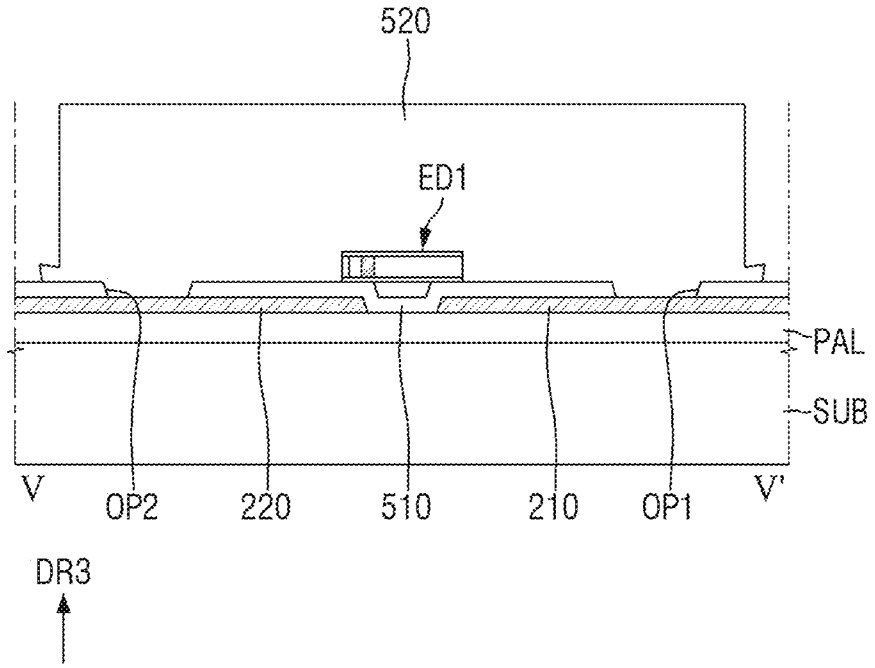
Figure 13:
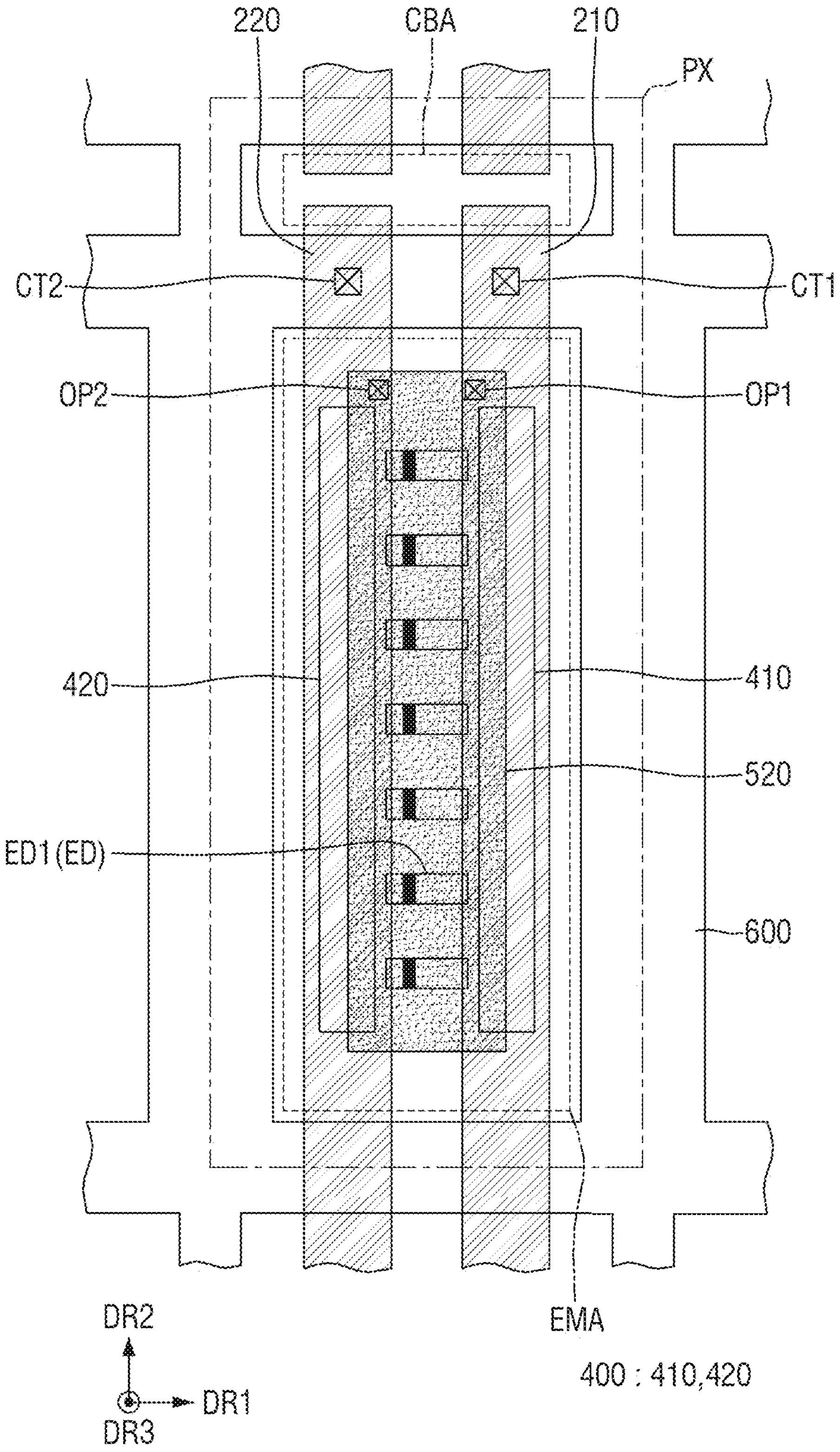

When the liquid treatment process described above is performed, the second light emitting elements ED2 may be removed from the substrate SUB as illustrated in FIGS. 11 to 13. In the present embodiment, the first insulating pattern material layer 520 may be integrated on one end of the first electrode 210 and one end of the second electrode 220 as well as on a space between the first electrode 210 and the second electrode 220 to be formed as a single pattern layer. The first insulating pattern material layer 520 may have a shape in which it extends in the second direction DR2 in a plan view within the emission area EMA. The first insulating pattern material layer 520 may form an island-shaped pattern. The first insulating pattern material layer 520 may be disposed to cover the first opening OP1 and the second opening OP2.

Figure 14:
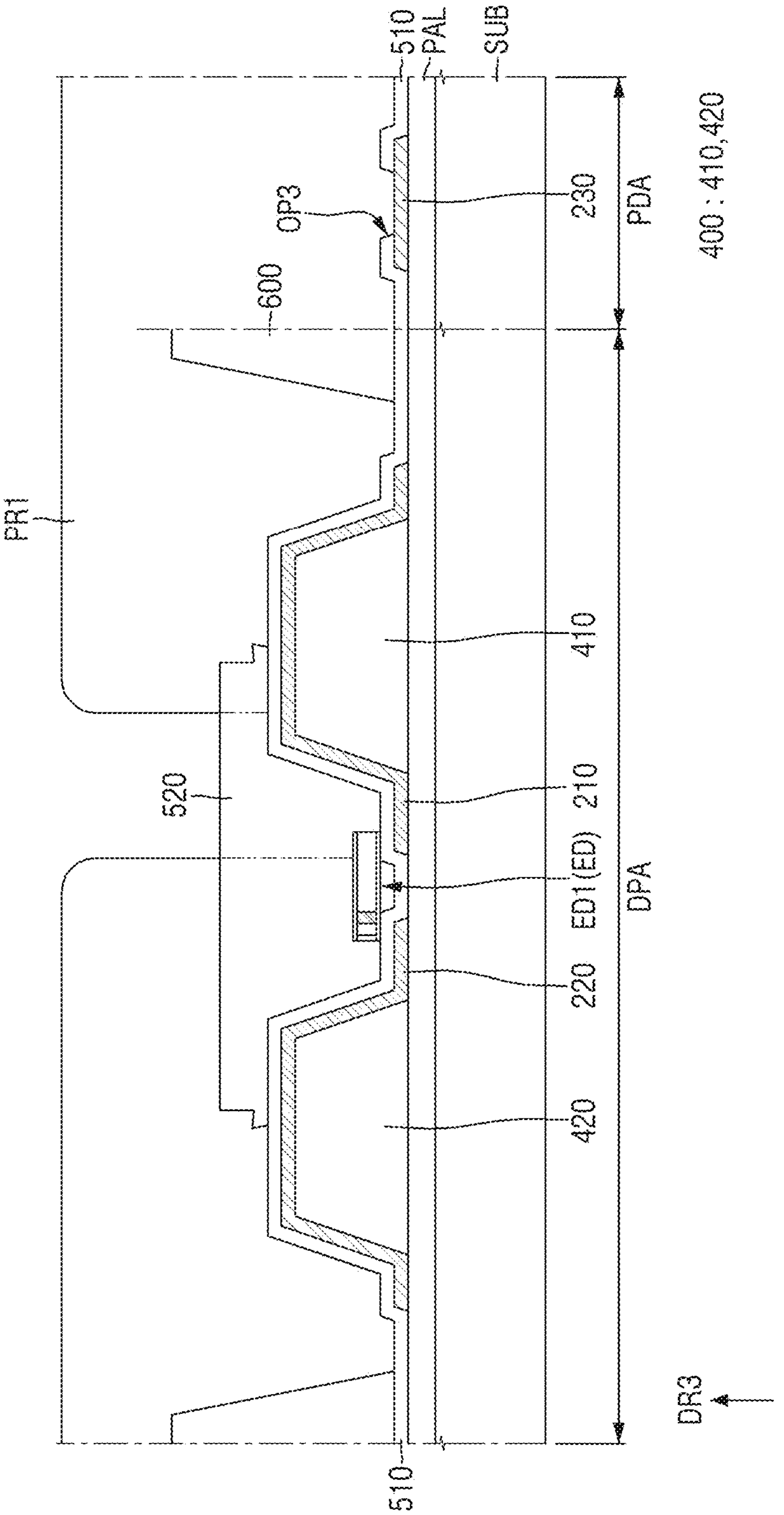
Figure 15:
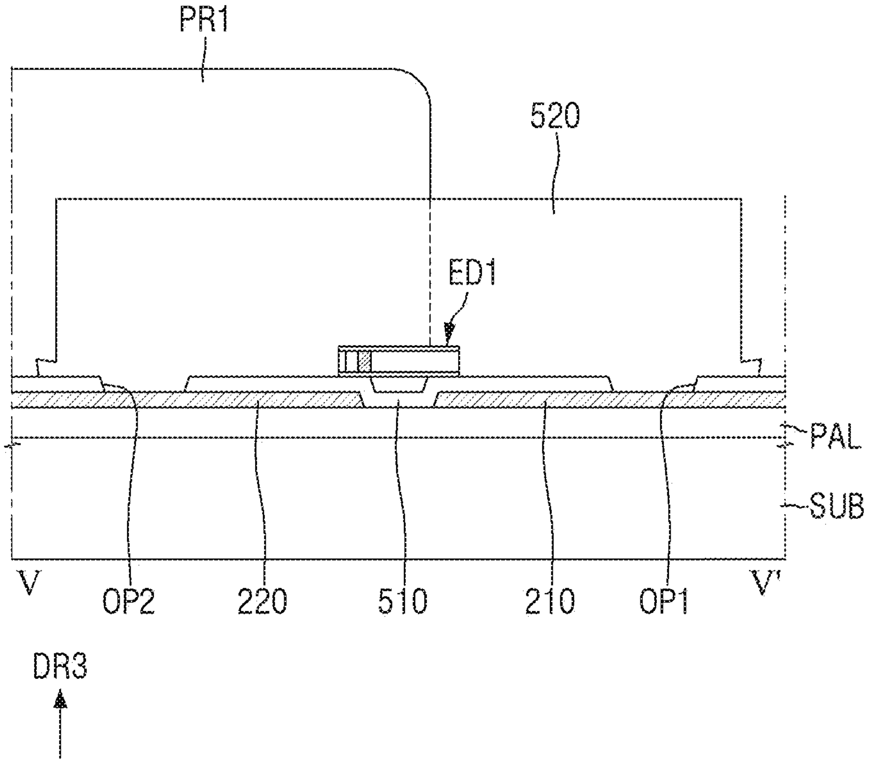

Next, referring to FIGS. 14 and 15, a first photoresist pattern PR1 is formed on the first insulating pattern material layer 520. The first photoresist pattern PR1 may be formed by forming a photoresist layer over the entirety of the substrate SUB and then performing exposure and development.

Specifically, the first photoresist pattern PR1 may be disposed over the entirety of the display area DPA and the pad area PDA. The first photoresist pattern PR1 may be formed to expose a space in which the light emitting elements ED and the first sub-bank 410 are spaced from and face each other. The first photoresist pattern PR1 may be formed to expose one ends of the light emitting elements ED and one side surface of the first sub-bank 410 adjacent to one ends of the light emitting elements ED. The first photoresist pattern PR1 may be formed to cover at least a portion of one end of the first insulating pattern material layer 520 disposed on the first sub-bank 410.

Figure 16:
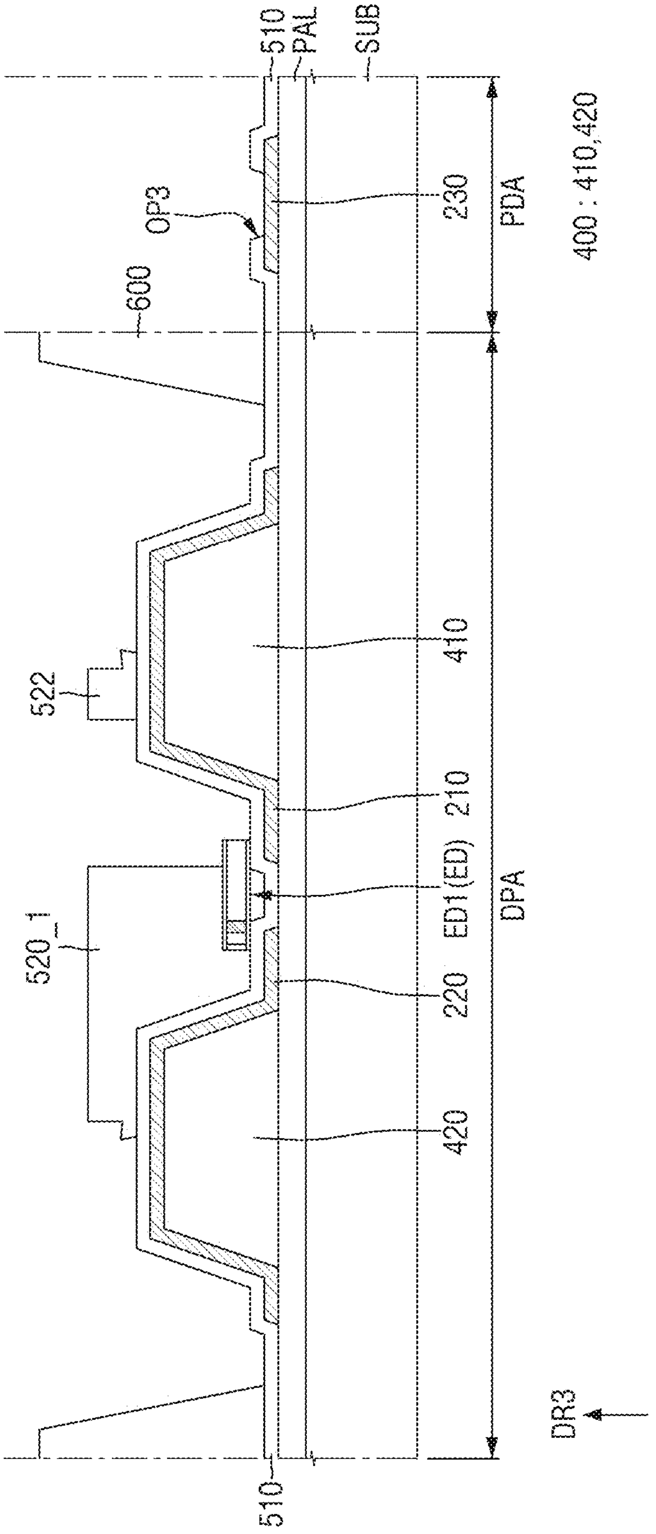
Figure 17:
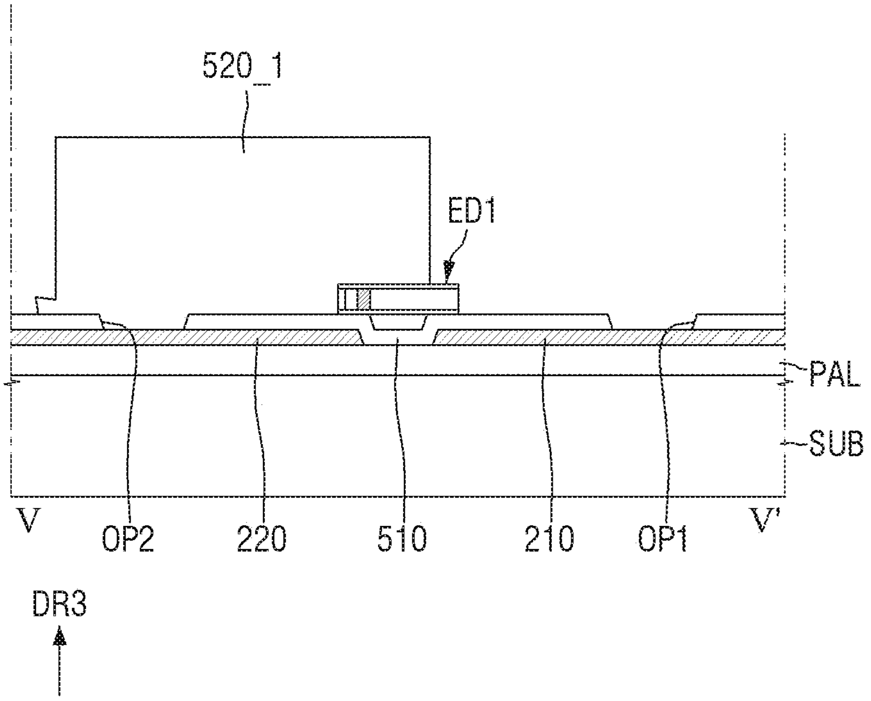
Figure 18:
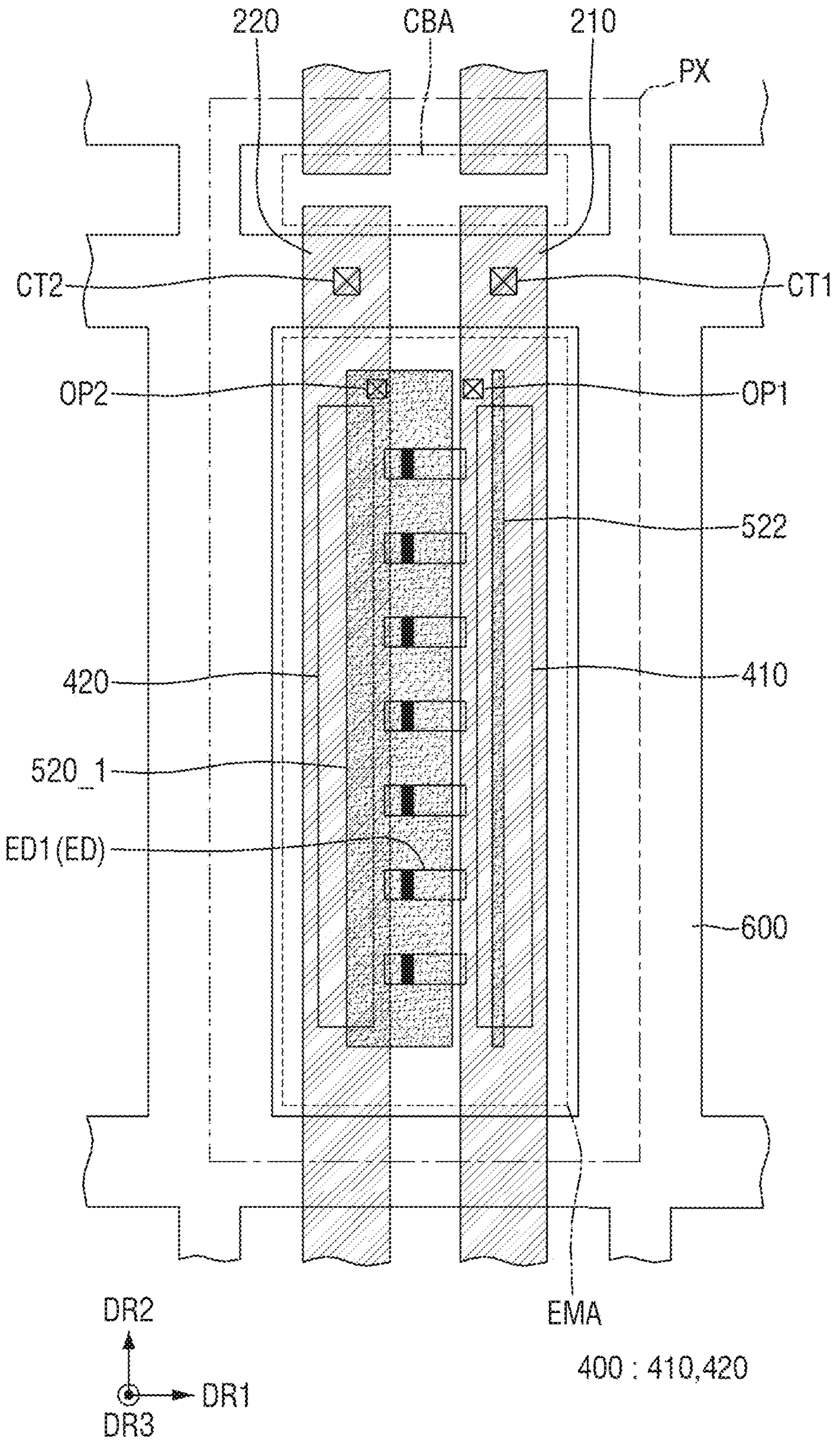

Next, referring to FIGS. 16 to 18, the first insulating pattern material layer 520 is etched using the first photoresist pattern PR1 as an etch mask. Through the present process, the first insulating pattern material layer 520 exposed by the first photoresist pattern PR1 is etched, such that a second insulating pattern material layer 520_1 and a second insulating pattern 522 spaced from each other in the first direction DR1 may be formed. The second insulating pattern material layer 520_1 and the second insulating pattern 522 may not overlap the first opening OP1 in the third direction DR3. That is, a portion of the first insulating pattern material layer 520 is etched by the etching process, such that the first opening OP1 may be exposed in the third direction DR3.

As described above, the first photoresist pattern PR1 may be formed to cover at least a portion of one end of the first insulating pattern material layer 520 disposed on the first sub-bank 410. The first photoresist pattern PR1 is formed to cover at least a portion of one end of the first insulating pattern material layer 520, and thus, the first insulating layer 510 disposed in an area overlapping with the second insulating pattern 522 and an area adjacent to the area may be protected by the first photoresist pattern PR1. Accordingly, it is possible to prevent the first insulating layer 510 disposed below the second insulating pattern 522 from being damaged by an etchant.

Figure 19:
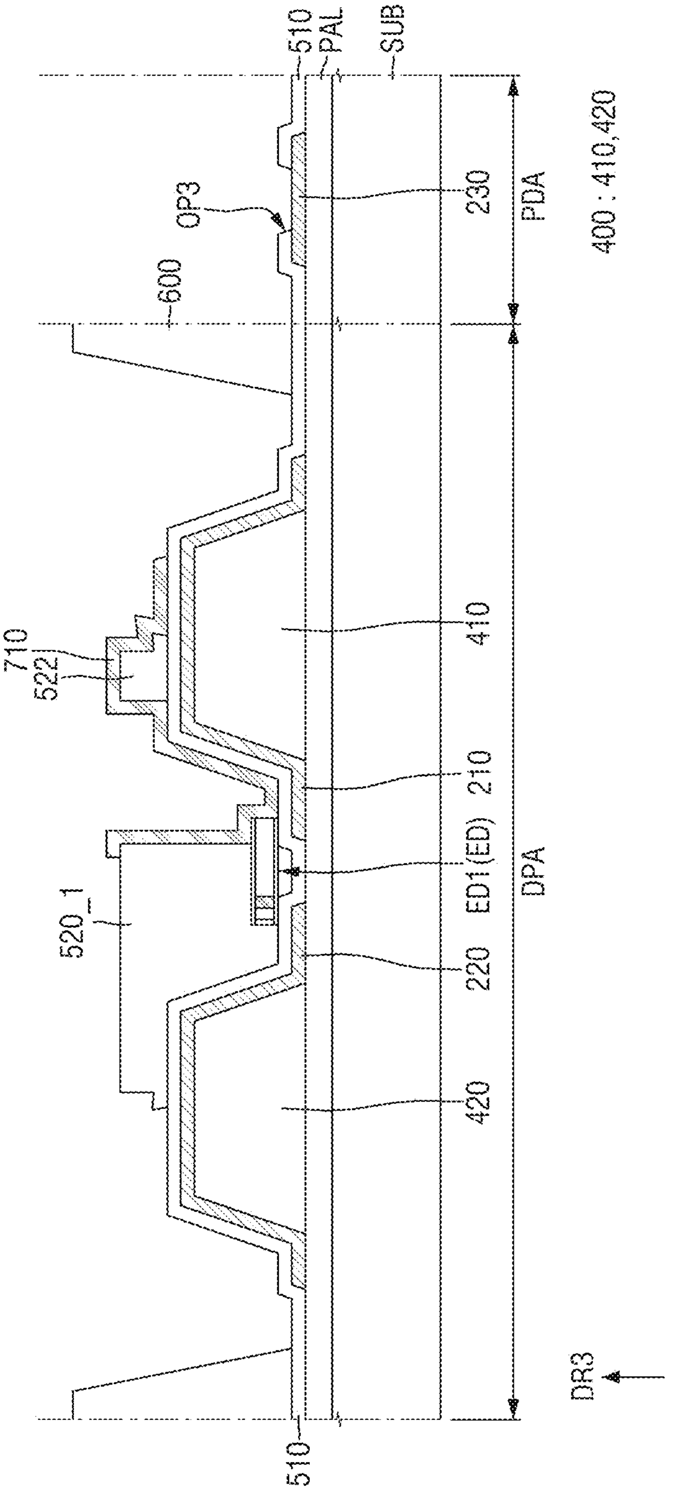
Figure 20:
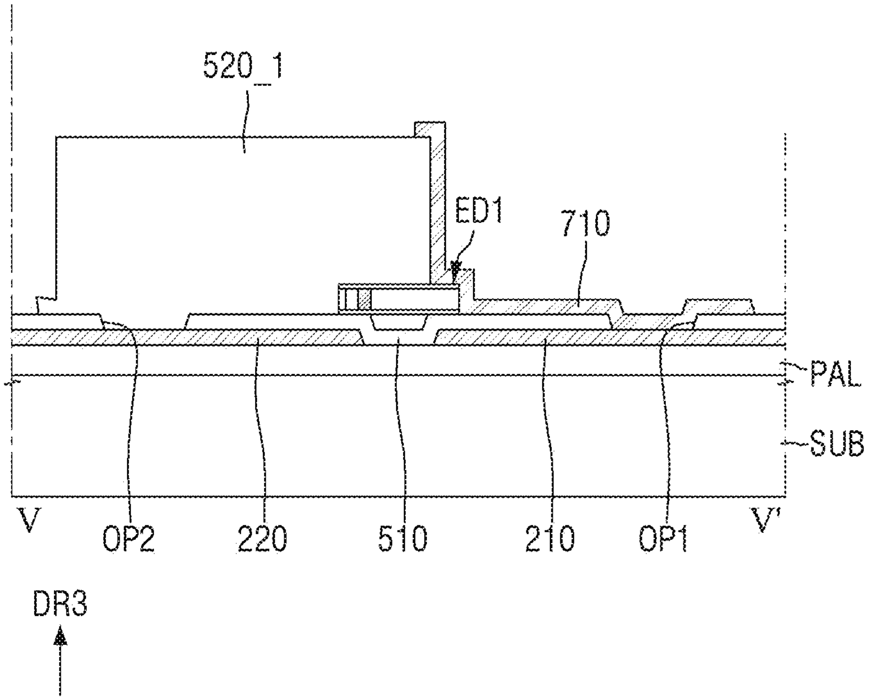
Figure 21:
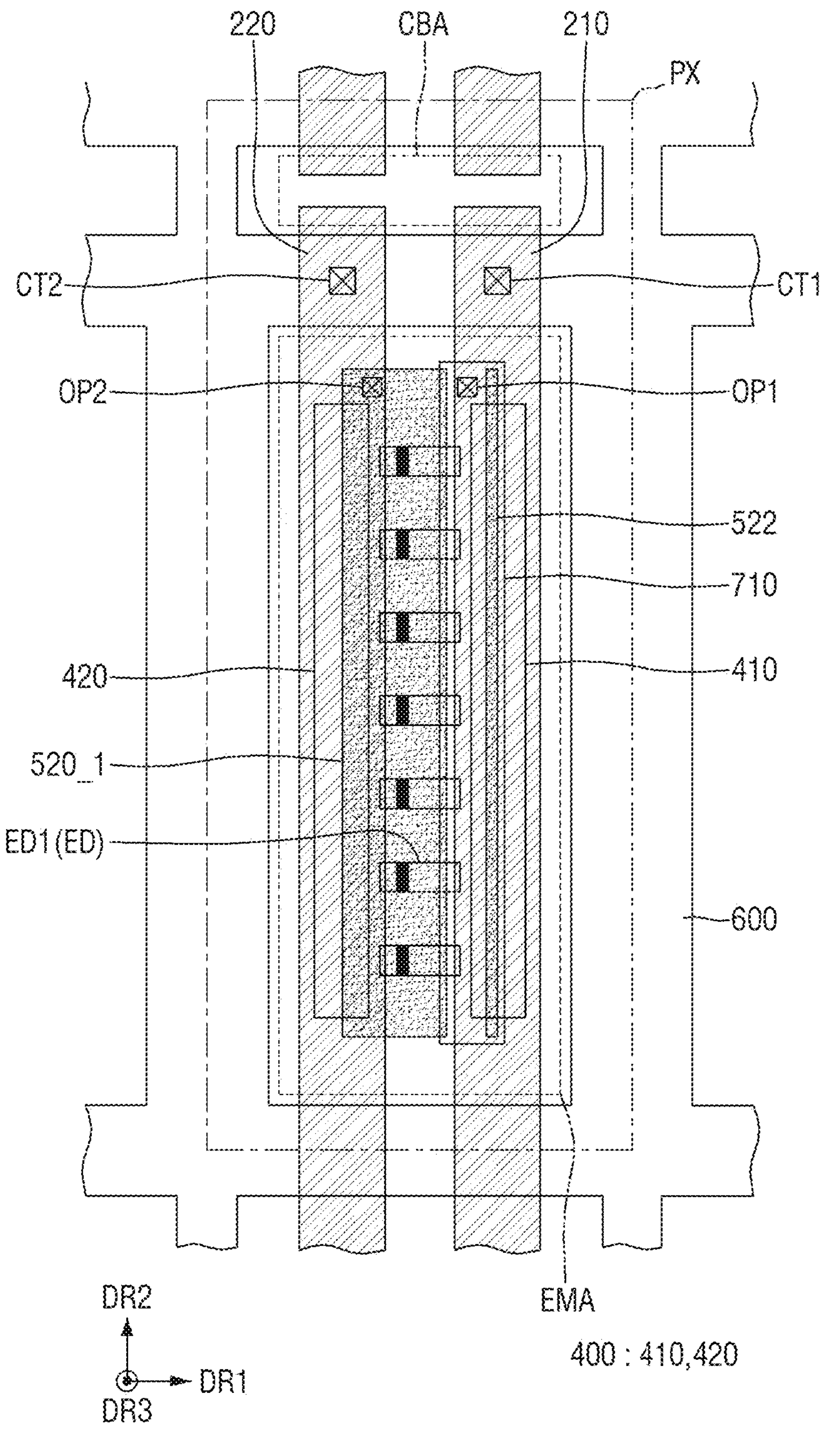

Next, referring to FIGS. 19 to 21, a patterned first contact electrode 710 may be formed on the first electrode 210. The patterned first contact electrode 710 may be formed by a mask process. For example, the first contact electrode 710 may be formed by entirely depositing a material layer for the first contact electrode on the display area DPA and then patterning the material layer for the first contact electrode. The material layer for the first contact electrode may be formed to overlap the first opening OP1, and the first electrode 210 exposed through the first opening OP1 and the first contact electrode 710 may be in contact with each other. The first contact electrode 710 may extend from one ends of the light emitting elements ED to be partially disposed on the second insulating pattern material layer 520_1.

Figure 22:
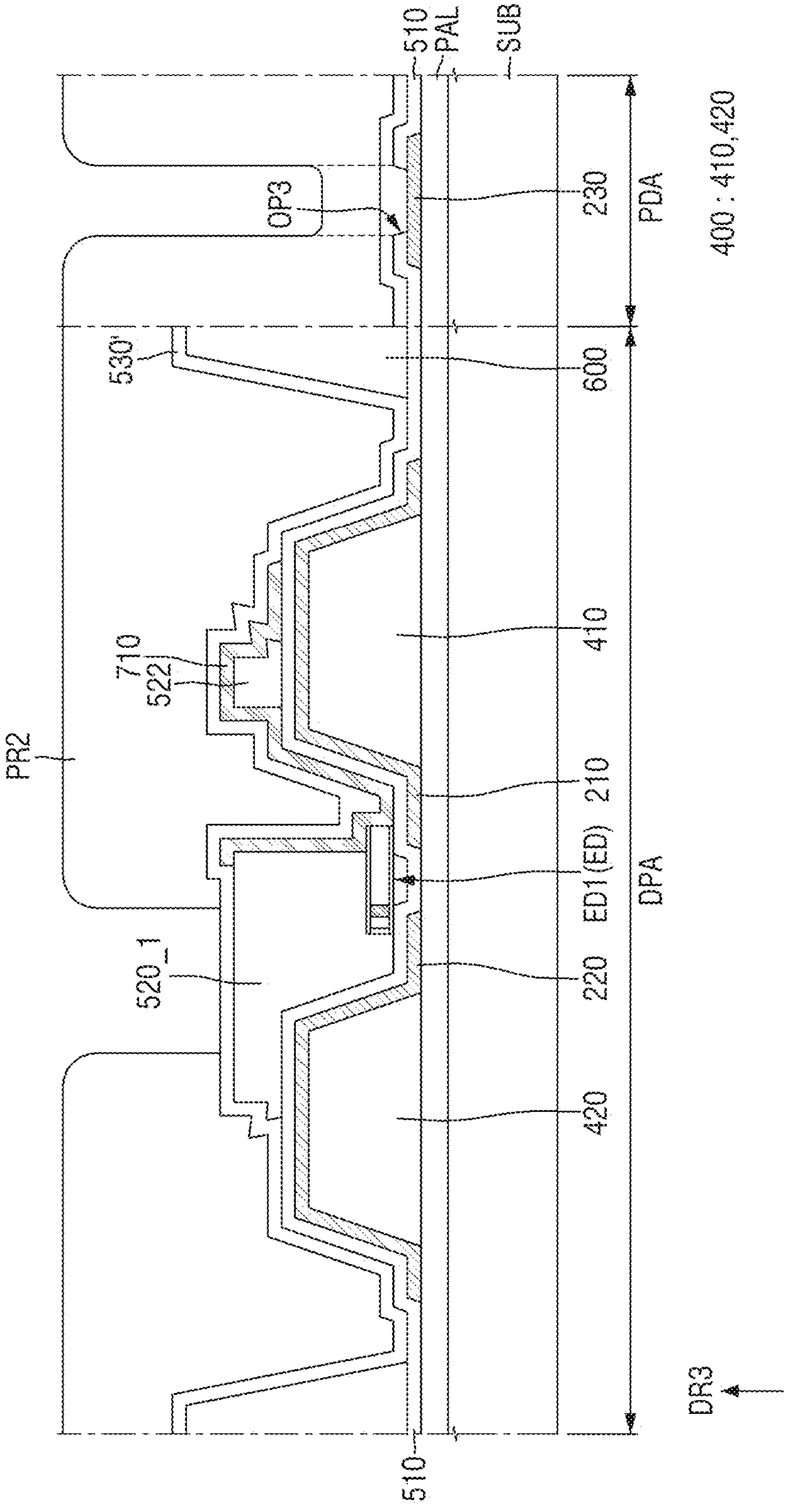
Figure 23:
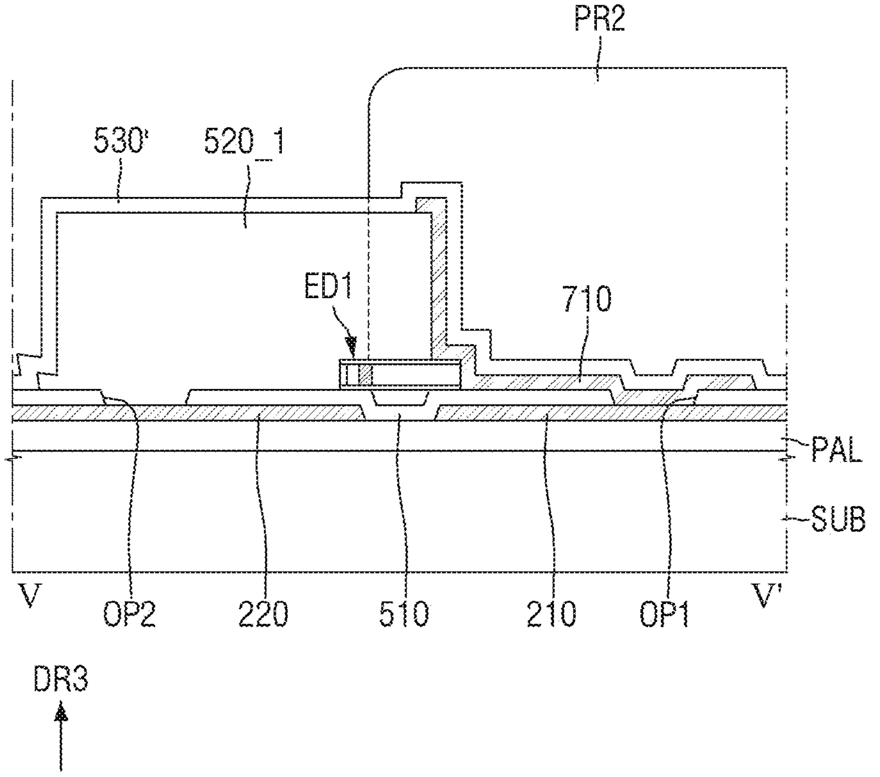

Next, referring to FIGS. 22 and 23, a material layer 530' for a second insulating layer is entirely deposited on the substrate SUB. Next, a second photoresist pattern PR2 is formed by forming a photoresist layer on the material layer 530' for a second insulating layer, and then performing exposure and development.

Specifically, the second photoresist pattern PR2 may be formed to expose a portion of the second insulating pattern material layer 520_1 and the material layer 530'. The second photoresist pattern PR2 may be formed to expose a space in which the light emitting elements ED and the second sub-bank 420 are spaced from and oppose each other. The second photoresist pattern PR2 may be formed to expose the other ends of the light emitting elements ED and one side surface of the second sub-bank 420 adjacent to the other ends of the light emitting elements ED. The second photoresist pattern PR2 may be formed to cover at least a portion of one end of the second insulating pattern material layer 520_1 and the material layer 530' disposed on the second sub-bank 420.

Figure 24:
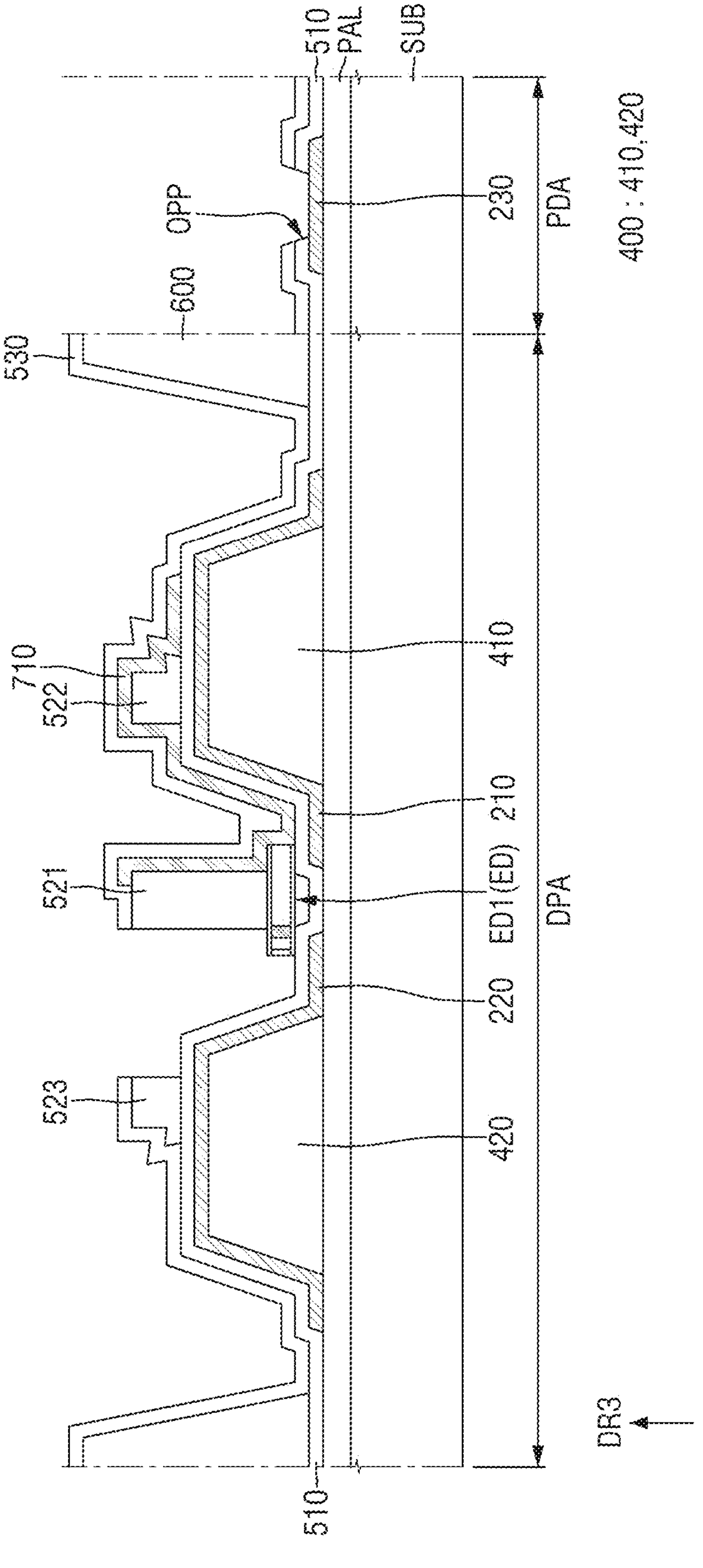
Figure 25:
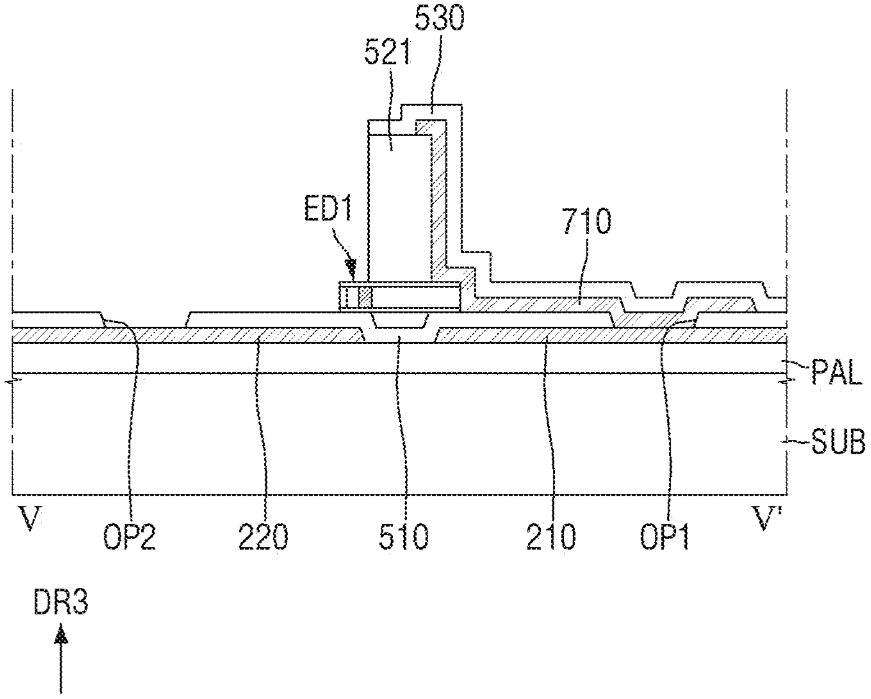
Figure 26:
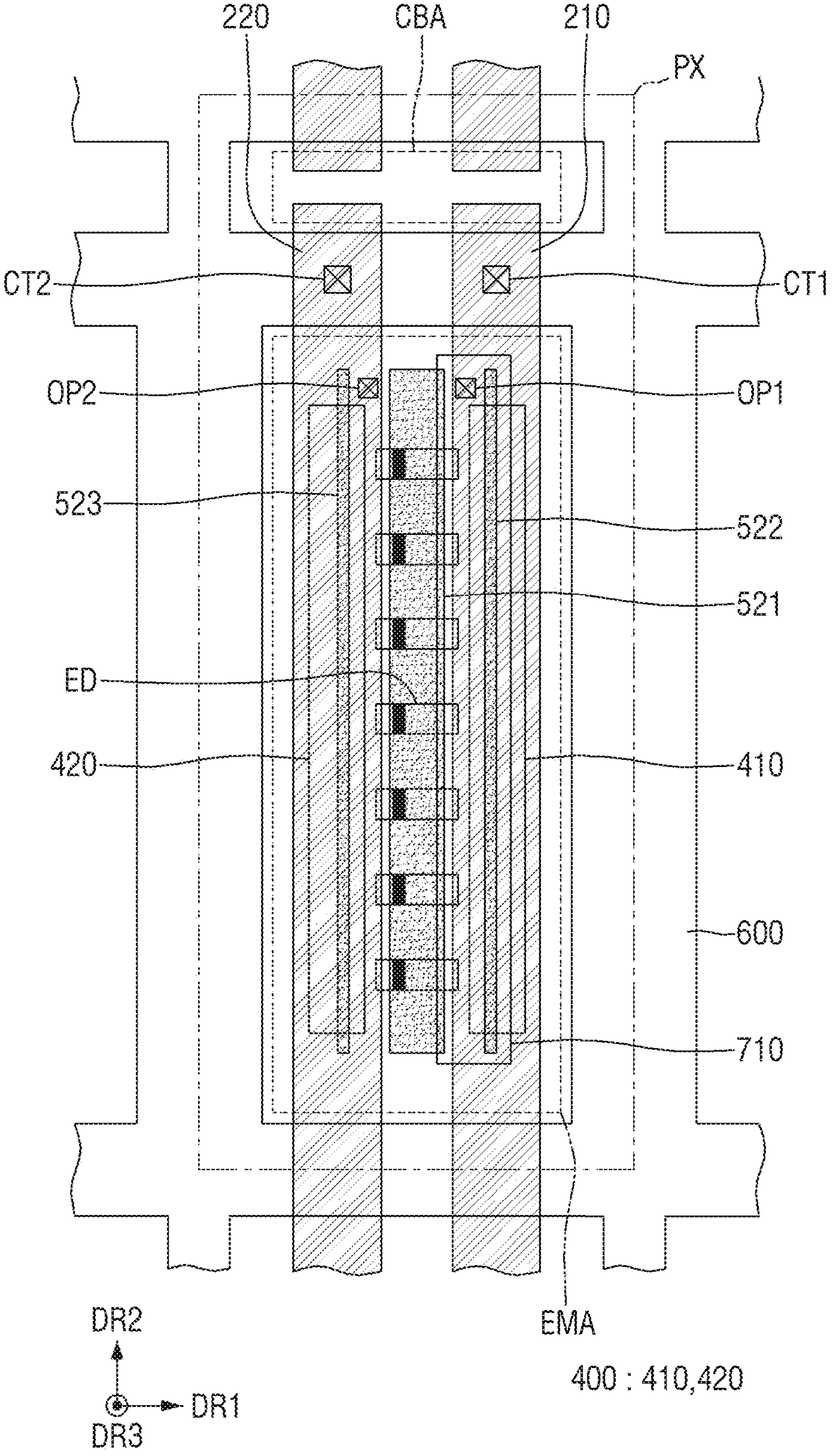

Next, referring to FIGS. 24 to 26, the second insulating pattern material layer 520_1 and the material layer 530' for a second insulating layer are etched using the second photoresist pattern PR2 as an etch mask. Through the present process, the second insulating pattern material layer 520_1 and the material layer 530' for a second insulating layer exposed by the second photoresist pattern PR2 are etched, such that the first insulating pattern 521 and the third insulating pattern 523 spaced from each other in the first direction DR1 may be formed. As described above, the second photoresist pattern PR2 is formed to cover at least a portion of the other end of the second insulating pattern material layer 520_1 disposed on the second sub-bank 420, such that the first insulating layer 510 disposed in an area covered by the material layer 520_1 covered by the second insulating pattern material layer 520_1 may be protected and not etched by the etching process. Through the present etching process, the second insulating pattern material layer 520_1 disposed on the second opening OP2 may be etched and exposed in the third direction DR3.

In the present etching process, the second insulating pattern material layer 520_1 and the material layer 530' for a second insulating layer are etched together, such that each of one side surfaces of the first insulating pattern 521 and the third insulating pattern 523 facing each other may be aligned with the second insulating layer 530.

Figure 27:
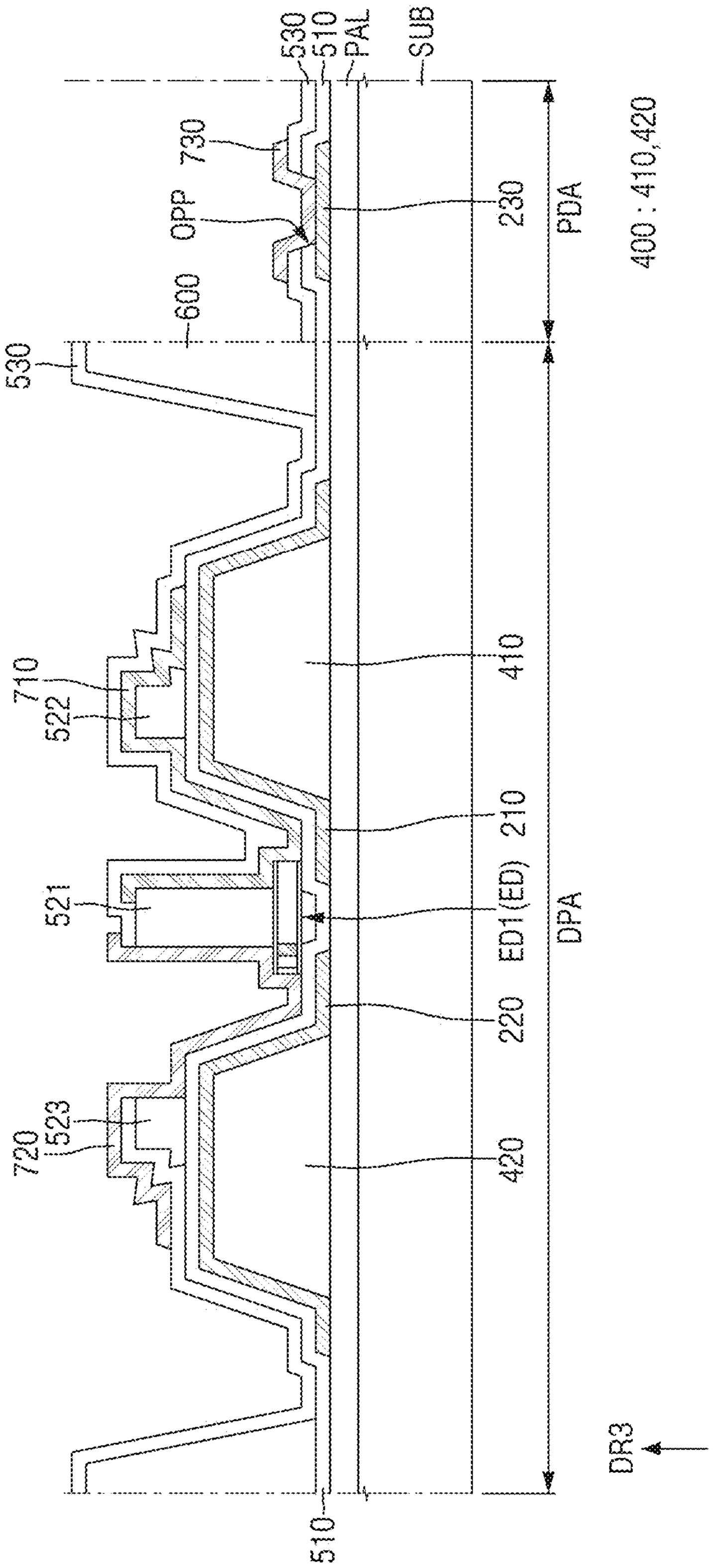
Figure 28:
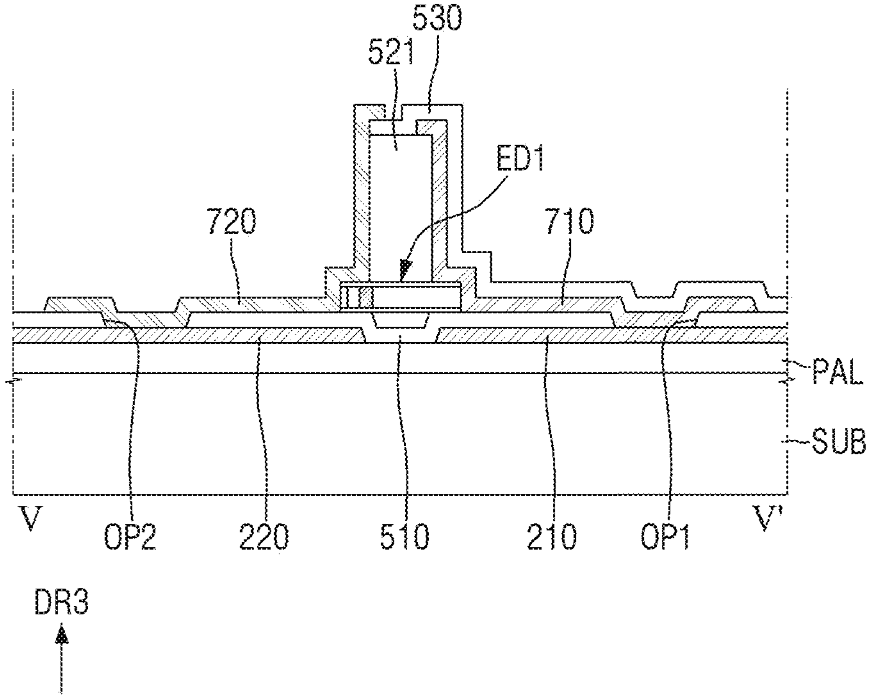

Next, referring to FIGS. 27 and 28, a patterned second contact electrode 720 disposed on the second electrode 220 in the display area DPA and a pad electrode 730 overlapping the connection electrode 230 in the pad area PDA may be formed. The patterned second contact electrode 720 and the pad electrode 730 may be formed by the same mask process. For example, the second contact electrode 720 and the pad electrode 730 may be formed by entirely depositing a material layer for the second contact electrode on the display area DPA and then patterning the material layer for the second contact electrode. The material layer for the second contact electrode may be formed to overlap the second opening OP2 and the pad opening OPP, the second electrode 220 exposed through the second opening OP2 and the second contact electrode 720 may be in contact with each other, and the connection electrode 230 exposed through the pad opening OPP and the pad electrode 730 may be in contact with each other. The second contact electrode 720 may extend from one ends of the light emitting elements ED to be partially disposed on the first insulating pattern 521.

Next, as illustrated in FIGS. 3 and 4, the third insulating layer 540 may be formed on the substrate SUB. The third insulating layer 540 may be entirely disposed in the display area DPA, and may be disposed to expose a portion of the pad electrode 730 in the pad area PDA.

Hereinafter, other embodiments will be described. In the following embodiments, an overlapping description of the same components as those described above will be omitted or simplified, and components different from those described above will be mainly described.

Figure 29:
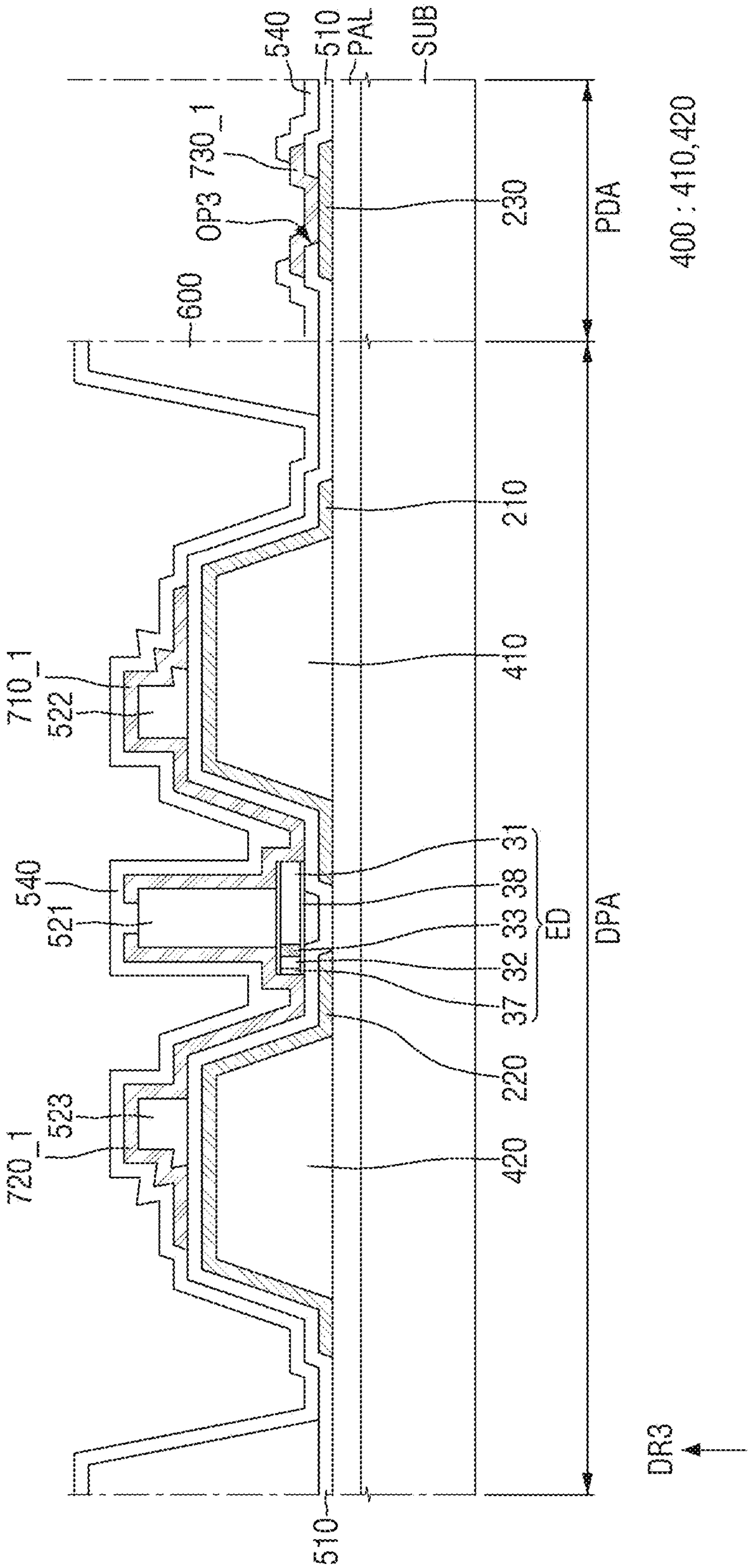
FIG. 29 is a schematic cross-sectional view of a display area and a pad area of a display device according to one or more embodiments.

FIG. 29 is a schematic cross-sectional view of a display area and a pad area of a display device according to one or more embodiments.

A display device according to the present embodiment is different from the display device according to an embodiment of FIG. 3 in that a first contact electrode 710_1, a second contact electrode 720_1, and a pad electrode 730_1 are formed as the same layer, and the second insulating layer 530 is omitted.

Specifically, the first contact electrode 710_1 and the second contact electrode 720_1 may be disposed at one end and the other end of the light emitting element, respectively, and may extend toward the first insulating pattern 521. The first contact electrode 710_1 and the second contact electrode 720_1 may be disposed to cover side surfaces of the first insulating pattern 521, respectively, and may be partially disposed on an upper surface of the first insulating pattern 521. The first contact electrode 710_1 and the second contact electrode 720_1 may be spaced from each other on the upper surface of the first insulating pattern 521.

The first contact electrode 710_1 may be disposed to cover the second insulating pattern 522. The second contact electrode 720_1 may be disposed to cover the third insulating pattern 523. The first contact electrode 710_1 may be directly disposed on an outer surface of the second insulating pattern 522, and the second contact electrode 720_1 may be directly disposed on an outer surface of the third insulating pattern 523, but the present disclosure is not limited thereto.

The first contact electrode 710_1 and the second contact electrode 720_1 are formed as the same layer, and thus, the second insulating layer 530 insulating the first contact electrode 710_1 and the second contact electrode 720_1 from each other may be omitted. Accordingly, a third opening OP3 formed in the first insulating layer 510 in the pad area PDA may be a pad opening of the pad electrode 730_1 and the connection electrode 230. An insulating layer disposed between the pad electrode 730_1 and the connection electrode 230 is the first insulating layer 510, and thus, a step may be decreased. Accordingly, contact reliability between the pad electrode 730_1 and the connection electrode 230 may be improved.

Figure 30:
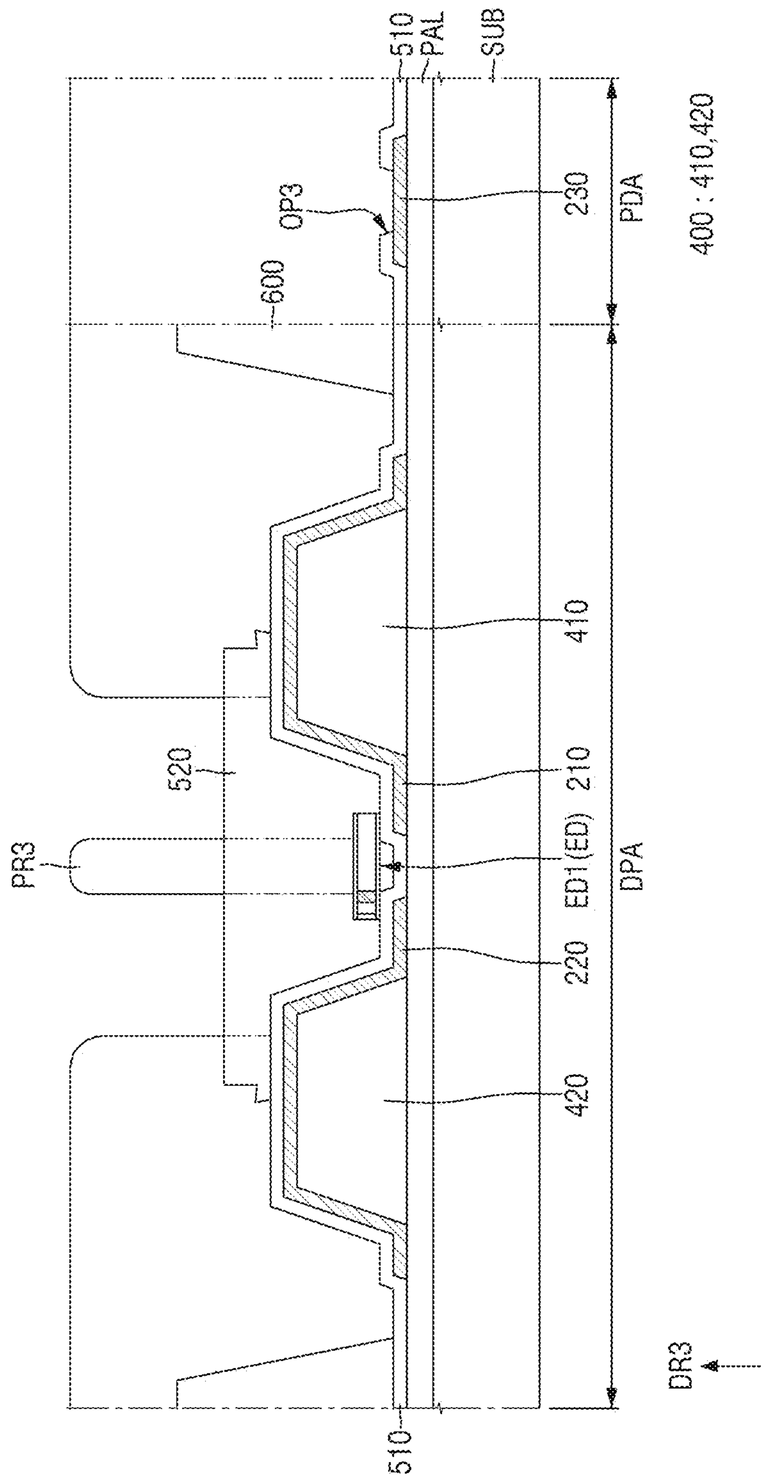
FIGS. 30 to 32 are cross-sectional views illustrating some process steps of a manufacturing method for the display device of FIG. 29.
Figure 31:
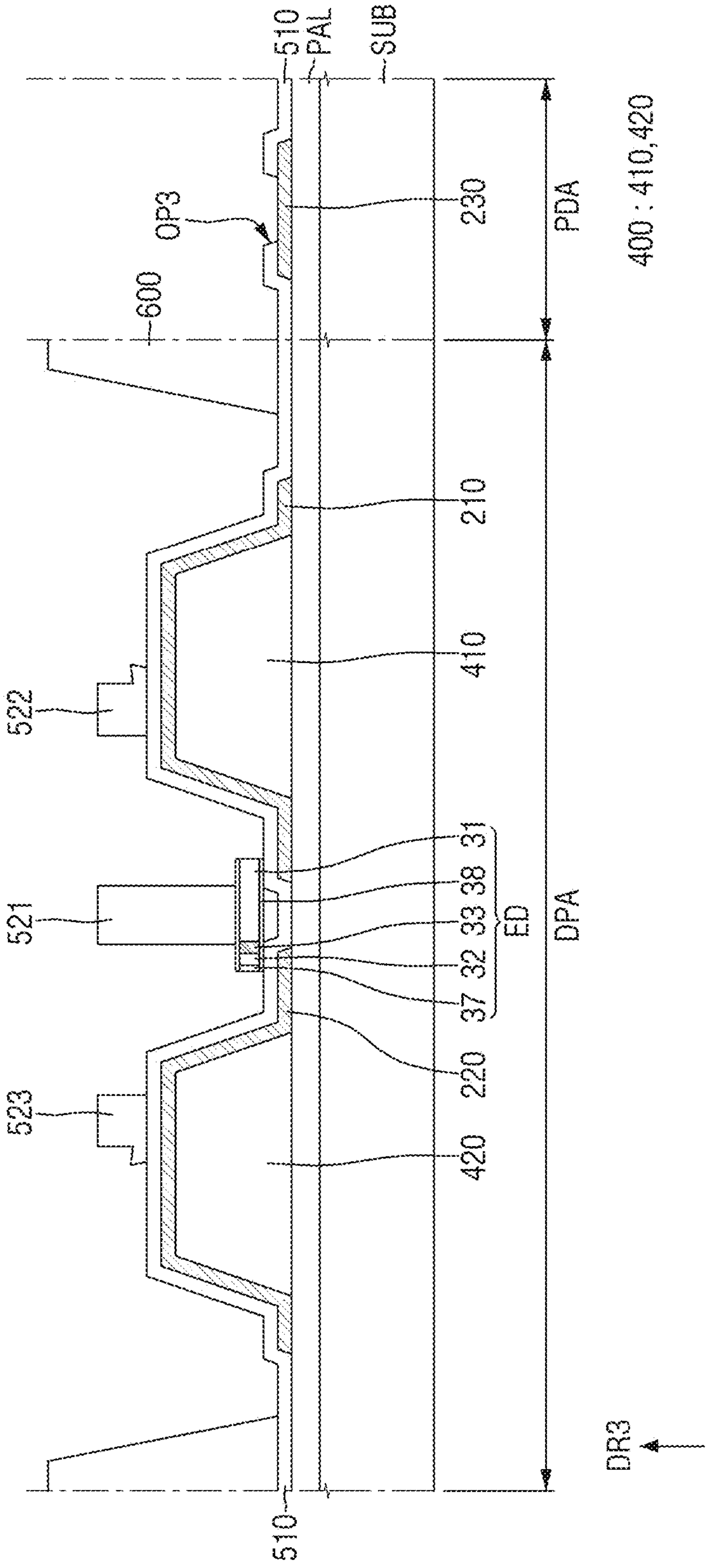
Figure 32:
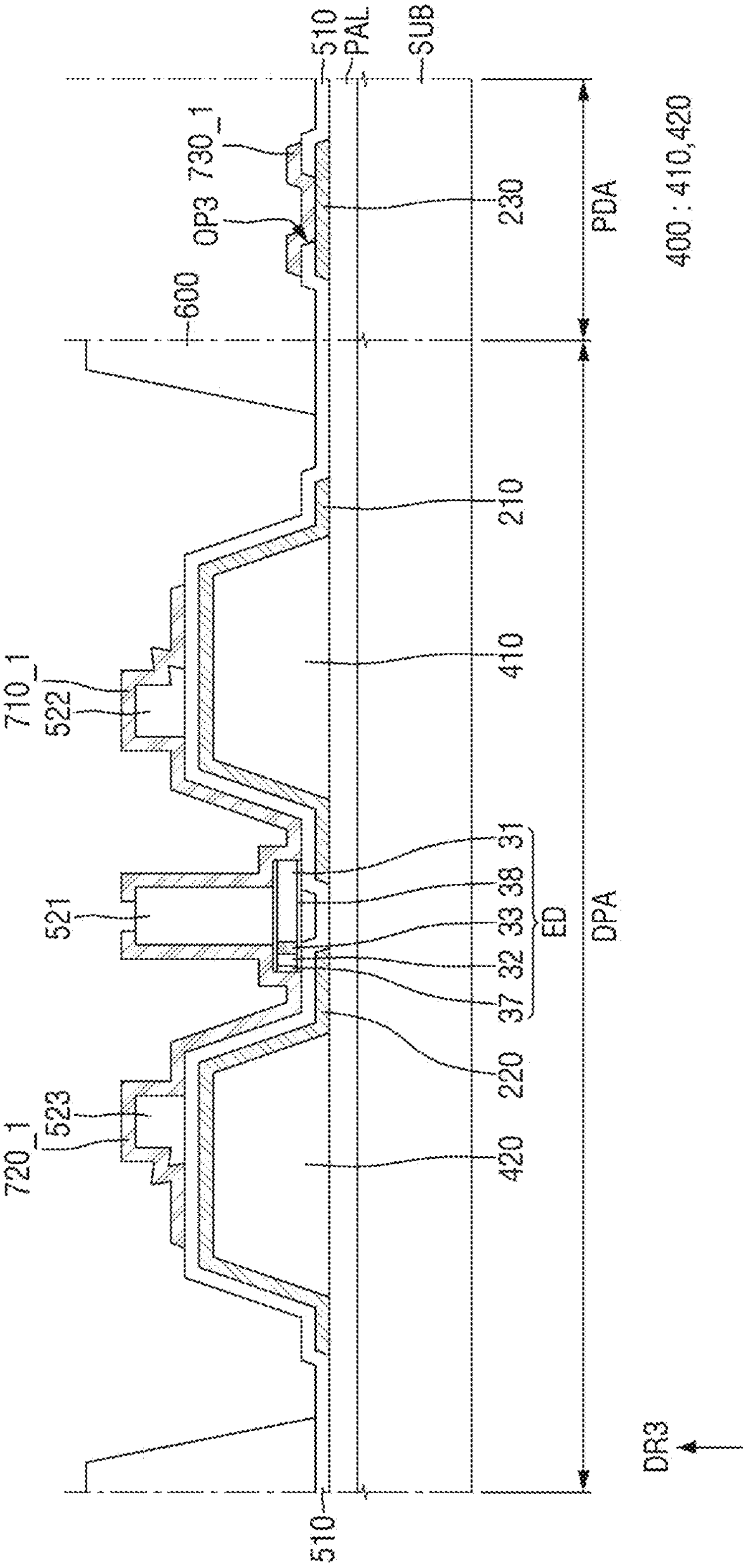

FIGS. 30 to 32 are cross-sectional views illustrating some process steps of a manufacturing method for the display device of FIG. 29.

Processes of forming the circuit element layer PAL, the first bank 400, the first and second electrodes 210 and 220, the first insulating layer 510, the light emitting elements ED, the second bank 600, and the first insulating pattern material layer 520 on the substrate SUB are the same as those of an embodiment of FIGS. 6 to 13.

Next, referring to FIG. 30, a third photoresist pattern PR3 is formed on the first insulating pattern material layer 520.

Specifically, a third photoresist pattern PR3 having a pattern shape of the first insulating pattern 521, the second insulating pattern 522, and the third insulating pattern 523 that are to remain is formed by applying a photoresist layer onto the first insulating pattern material layer 520 and the first insulating layer 510 and performing exposure and development. In this case, the third photoresist pattern PR3 may be disposed to overlap at least portions of both ends of the first insulating pattern material layer 520. The third photoresist pattern PR3 is disposed to overlap at least portions of both ends of the first insulating pattern material layer 520, such that the first insulating layer 510 may be protected by the third photoresist pattern PR3. Accordingly, it is possible to prevent the first insulating layer 510 from being damaged by an etchant used to etch the first insulating pattern material layer 520.

Next, referring to FIGS. 30 and 31, the first insulating pattern material layer 520 is etched using the third photoresist pattern PR3 as an etch mask. The first insulating pattern material layer 520 may form the first insulating pattern 521, the second insulating pattern 522, and the third insulating pattern 523 spaced from each other in the first direction DR1 by etching using the third photoresist pattern PR3.

Next, referring to FIG. 32, the first and second contact electrodes 710_1 and 720_1 may be formed on the first insulating layer 510, the first insulating pattern 521, the second insulating pattern 522, and the third insulating pattern 523 in the display area DPA, and the pad electrode 730_1 may be formed on the first insulating layer 510 in the pad area PDA. The first and second contact electrodes 710_1 and 720_1 and the pad electrode 730_1 may be formed by entirely depositing a material layer for a contact electrode on the substrate SUB and then patterning the material layer for a contact electrode.

In the manufacturing method for the display device according to the present embodiment, the first to third insulating patterns 521, 522, and 523 are patterned and formed through the same mask process and the first and second contact electrodes 710_1 and 720_1 and the pad electrode 730_1 are patterned and formed through the same mask process, and accordingly, a mask process may be omitted. Accordingly, separate additional mask processes for forming the first and second contact electrodes, respectively are not required, and thus, process efficiency may be improved.

In concluding the detailed description, those skilled in the art will appreciate that many variations and modifications can be made to the embodiments without substantially departing from the principles and scope of the present disclosure. Therefore, the embodiments of the present disclosure are used in a generic and descriptive sense only and not for purposes of limitation.

The invention claimed is:

1. A display device comprising:

a substrate;

a first electrode on the substrate;

a second electrode spaced from the first electrode on the substrate in a first direction perpendicular to a thickness direction of the substrate;

a light emitting element on the first electrode and the second electrode, respective ends of the light emitting element being on the first electrode and the second electrode;

a first insulating pattern on the light emitting element and exposing the ends of the light emitting element;

a second insulating pattern on the first electrode and entirely spaced from the first insulating pattern in the first direction;

a third insulating pattern on the second electrode and spaced from the first insulating pattern and the second insulating pattern;

a first contact electrode on the first electrode and in contact with one end of the light emitting element and the first electrode; and a second contact electrode on the second electrode and in contact with the other end of the light emitting element and the second electrode, wherein the first contact electrode covers the first insulating pattern, wherein the second contact electrode covers the third insulating pattern, wherein the first insulating pattern and the second insulating pattern comprise a same material, and wherein the second insulating pattern does not overlap the first insulating pattern in the thickness direction.

2. The display device of claim 1, wherein the first contact electrode covers the first insulating pattern.

3. The display device of claim 2, further comprising a first insulating layer on the first electrode and the second electrode, wherein the light emitting element and the second insulating pattern are on the first insulating layer, and wherein the first contact electrode is in contact with the first electrode through a first opening penetrating through the first insulating layer.

4. The display device of claim 3, wherein the first opening does not overlap the first insulating pattern and the second insulating pattern in the thickness direction of the substrate.

5. The display device of claim 1, wherein the third insulating pattern comprises the same material as the first and second insulating patterns.

6. The display device of claim 5, wherein the first contact electrode and the second contact electrode are spaced from each other on the first insulating pattern.

7. The display device of claim 1, wherein a thickness of the first insulating pattern is greater than a thickness of the second insulating pattern.

8. The display device of claim 1, wherein the second insulating pattern does not overlap both ends of the first electrode in the thickness direction of the substrate.

9. The display device of claim 8, wherein each of the first insulating pattern and the second insulating pattern has an island shape in a plan view.

10. The display device of claim 1, wherein a cross-sectional shape of the second insulating pattern is a shape in which one side surface of the second insulating pattern opposing the first insulating pattern is parallel to the first insulating pattern and an other side surface of the second insulating pattern protrudes outward of an emission area of the display device.

11. A display device comprising:

a substrate;

a first electrode on one surface of the substrate and extending in a first direction;

a second electrode spaced from the first electrode, on the one surface of the substrate, and extending in the first direction;

a light emitting element on the first electrode and the second electrode, respective ends of the light emitting element being on the first electrode and the second electrode;

a first insulating pattern on the substrate in an area between the first electrode and the second electrode and extending in the first direction; and a second insulating pattern spaced from the first insulating pattern, on the first electrode, and extending in the first direction;

a third insulating pattern on the second electrode and spaced from the first insulating pattern and the second insulating pattern;

a first contact electrode on the first electrode and in contact with one end of the light emitting element and the first electrode; and a second contact electrode on the second electrode and in contact with the other end of the light emitting element and the second electrode, wherein the first contact electrode covers the first insulating pattern, wherein the second contact electrode covers the third insulating pattern, wherein at least a portion of the first insulating pattern is on the light emitting element, and does not overlap the ends of the light emitting element in a thickness direction of the substrate, wherein the second insulating pattern does not overlap both ends of the first electrode in the thickness direction of the substrate, and wherein a thickness of the first insulating pattern is greater than a diameter of the light emitting elements.

12. The display device of claim 11, wherein the first contact electrode extends in the first direction, and covers the second insulating pattern.

13. The display device of claim 11, wherein the first insulating pattern and the second insulating pattern comprise a same material.

14. A manufacturing method for a display device, the method comprising:

preparing a substrate comprising a first electrode and a second electrode that are spaced from and opposing each other, and a plurality of light emitting elements on the first electrode or the second electrode; and disposing a shadow mask on the substrate and forming an insulating pattern material layer on the first electrode and the second electrode as well as on an area between the first electrode and the second electrode using the shadow mask, wherein the insulating pattern material layer:

overlaps one end of the first electrode opposing the second electrode and one end of the second electrode opposing the first electrode, in a thickness direction of the substrate, and does not overlap an other end of the first electrode and an other end of the second electrode in the thickness direction of the substrate.

15. The manufacturing method of claim 14, wherein the plurality of light emitting elements comprises a first light emitting element having respective ends on the first electrode and the second electrode, and a second light emitting element having two ends, wherein at least one of the two ends of the second light emitting element is not on the first electrode or the second electrode, and wherein the insulating pattern material layer covers the first light emitting element.

16. The manufacturing method of claim 15, wherein the insulating pattern material layer does not overlap the second light emitting element in the thickness direction of the substrate, the manufacturing method for the display device further comprising, after the forming of the insulating pattern material layer, removing the second light emitting element.

17. The manufacturing method of claim 16, wherein in the removing of the second light emitting element, the first light emitting element is covered by the insulating pattern material layer and is not removed.

18. The manufacturing method of claim 14, further comprising forming a first insulating pattern, a second insulating pattern, and a third insulating pattern by etching the insulating pattern material layer, wherein the first insulating pattern is on the plurality of light emitting elements and exposes both ends of the plurality of light emitting elements, wherein the second insulating pattern is on the first electrode, wherein the third insulating pattern is on the second electrode, and wherein the first insulating pattern, the second insulating pattern, and the third insulating pattern are spaced from each other.

19. The manufacturing method for the display device of claim 18, further comprising forming a first contact electrode in contact with one ends of the plurality of light emitting elements and the first electrode and a second contact electrode in contact with other ends of the plurality of light emitting elements and the second electrode, wherein the first contact electrode and the second contact electrode are spaced from each other, wherein the first contact electrode is on the first electrode and covers the second insulating pattern, and wherein the second contact electrode is on the second electrode and covers the third insulating pattern.

* * * * *